(12) United States Patent
Nagai

(10) Patent No.: US 7,786,923 B2
(45) Date of Patent: Aug. 31, 2010

(54) INTERROGATOR OF COMMUNICATION SYSTEM

(75) Inventor: Takuya Nagai, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 723 days.

(21) Appl. No.: 11/346,183

(22) Filed: Feb. 3, 2006

(65) Prior Publication Data

US 2006/0208939 A1 Sep. 21, 2006

Related U.S. Application Data

(63) Continuation-in-part of application No. PCT/JP2004/011354, filed on Aug. 6, 2004.

(30) Foreign Application Priority Data

Aug. 20, 2003 (JP) ............................. 2003-296853

(51) Int. Cl.
*G01S 13/74* (2006.01)
*G01S 13/00* (2006.01)

(52) U.S. Cl. .................. 342/42; 342/43; 342/175; 342/195; 340/505; 340/10.1

(58) Field of Classification Search ............. 342/29–51, 342/82–93, 175, 194–197, 159–165, 173, 342/174; 455/39, 41.2, 130, 230, 232.1, 455/234.1, 239.1; 340/505, 870.07, 870.18, 340/500, 501, 825, 10.1–10.52; 375/130–153, 375/316, 322, 329

See application file for complete search history.

(56) References Cited

U.S. PATENT DOCUMENTS

| 5,617,060 | A | * | 4/1997 | Wilson et al. | ............. | 455/239.1 |
| 5,784,686 | A | * | 7/1998 | Wu et al. | ....................... | 342/44 |
| 6,122,329 | A | * | 9/2000 | Zai et al. | ....................... | 342/42 |
| 6,501,807 | B1 | * | 12/2002 | Chieu et al. | ................ | 455/41.2 |
| 6,516,186 | B1 | | 2/2003 | Yamagishi et al. | | |
| 6,600,905 | B2 | * | 7/2003 | Greeff et al. | ................ | 340/505 |
| 6,611,224 | B1 | * | 8/2003 | Nysen et al. | ................... | 342/42 |

FOREIGN PATENT DOCUMENTS

| JP | A 63-267042 | 11/1988 |
| JP | A 06-231314 | 8/1994 |

(Continued)

*Primary Examiner*—Bernarr E Gregory
(74) *Attorney, Agent, or Firm*—Oliff & Berridge, PLC

(57) ABSTRACT

An interrogator that is to be incorporated in a communication system in which each of at least one transponder is operable, upon reception of a main carrier wave transmitted from the interrogator, to respond to the interrogator with a reflected wave that is generated by modulating the main carrier wave. The interrogator includes: (a) a transmitting portion operable to transmit the main carrier wave; (b) a receiving portion operable to receive the reflected wave as a received signal; (c) at least one first frequency-converter each operable to generate an intermediate frequency signal, by multiplying the received signal with a first local signal that is generated by a first local oscillator; (d) at least one second frequency-converter each operable to generate a demodulated signal, by multiplying the intermediate frequency signal or a converted signal converted from the intermediate frequency signal, with a second local signal that is generated by a second local oscillator; and (d) a phase controller operable to control phase of the second local signal.

21 Claims, 23 Drawing Sheets

FOREIGN PATENT DOCUMENTS

| | | |
|---|---|---|
| JP | A 08-136648 | 5/1996 |
| JP | A-2000-115265 | 4/2000 |
| JP | B2 31-05825 | 9/2000 |
| JP | A 2000-286749 | 10/2000 |
| JP | A-2002-057590 | 2/2002 |
| JP | A 2002-208979 | 7/2002 |
| JP | A 2003-209589 | 7/2003 |

* cited by examiner

FIG. 20 cos(θ+dθ)

| θ \ dθ | 0 | 15 | 30 | 45 | 60 | 75 | 90 | 105 | 120 | 135 | 150 | 165 |
|---|---|---|---|---|---|---|---|---|---|---|---|---|
| 0 | 1.000 | 0.966 | 0.866 | 0.707 | 0.500 | 0.259 | 0.000 | -0.259 | -0.500 | -0.707 | -0.688 | -0.966 |
| 90 | 0.000 | -0.259 | -0.500 | -0.707 | -0.866 | -0.966 | -1.000 | -0.966 | -0.866 | -0.707 | -0.500 | -0.259 |
| 180 | -1.000 | -0.966 | -0.866 | -0.707 | -0.500 | -0.259 | 0.000 | 0.259 | 0.500 | 0.707 | 0.866 | 0.966 |
| 270 | 0.000 | 0.259 | 0.500 | 0.707 | 0.866 | 0.966 | 1.000 | 0.966 | 0.866 | 0.707 | 0.500 | 0.259 |

— 66

FIG. 21 sin(θ+dθ)

| θ \ dθ | 0 | 15 | 30 | 45 | 60 | 75 | 90 | 105 | 120 | 135 | 150 | 165 |
|---|---|---|---|---|---|---|---|---|---|---|---|---|
| 0 | 0.000 | 0.259 | 0.500 | 0.707 | 0.866 | 0.966 | 1.000 | 0.966 | 0.866 | 0.707 | 0.500 | 0.259 |
| 90 | 1.000 | 0.966 | 0.866 | 0.707 | 0.500 | 0.259 | 0.000 | -0.259 | -0.500 | -0.707 | -0.866 | -0.966 |
| 180 | 0.000 | -0.259 | -0.500 | -0.707 | -0.866 | -0.966 | -1.000 | -0.966 | -0.866 | -0.707 | -0.500 | -0.259 |
| 270 | -1.000 | -0.966 | -0.866 | -0.707 | -0.500 | -0.259 | 0.000 | 0.259 | 0.500 | 0.707 | 0.866 | 0.966 |

— 68

INTERROGATOR OF COMMUNICATION SYSTEM

This is a Continuation-In-Part of Application No. PCT/JP 2004/011354 filed on Aug. 6, 2004, which claims benefit of Japanese Patent Application No. 2003-296853 filed on Aug. 20, 2003. The entire disclosure of the prior applications is hereby incorporated by reference herein in its entirety.

BACKGROUND OF THE INVENTION

1. Field of the Invention

The present invention relates to an interrogator that is to be incorporated in a communication system in which each of at least one transponder is operable, upon reception of a main carrier wave transmitted from the interrogator, to respond to the interrogator with a reflected wave that is generated by modulating the main carrier wave.

2. Discussion of Related Art

There is known a communication system in which each of at least one transponder is operable, upon reception of a main carrier wave transmitted from the interrogator, to respond to the interrogator with a reflected wave that is generated by modulating the main carrier wave. For example, JP-3105825 B2 (publication of Japanese Patent issued in 2000) discloses an automatic gain controller circuit which is arranged to accurately detect a signal related to modulation performed by the transponder and which is accordingly applicable to such a communication system. This automatic gain controller circuit includes two circuits, wherein a first level detection/determination circuit as one of the two circuits is operated, where an actual electric field for input reception is considerably deviated from a desired electric field due to movement of the transponder, interference wave or other influencing factor, to adjust a gain corresponding to the deviation, and a second level detection/determination circuit as the other of the two circuits is operated, after the operation of the first level detection/determination circuit, to finely adjust the gain. That is, in the automatic gain controller circuit, realization of an accurate and rapid control of the gain is intended.

However, since the signal related to the modulation performed by the transponder, i.e., transmitted information signal is provided by an extremely small signal, the conventional technique does not necessarily make it possible to satisfactorily detect the signal related to the modulation performed by the transponder, for example, where a communication distance is relatively long or where there exist reflected waves respectively transmitted from a plurality of transponders.

SUMMARY OF THE INVENTION

The present invention was made in the light of the background prior art discussed above. It is therefore an object of the invention to provide an interrogator of a communication system that is capable of satisfactorily detecting a signal related to modulation performed by a transponder of the communication system. This object may be achieved by any one of first through twenty-first aspects of the invention that are described below.

The first aspect of this invention provides an interrogator that is to be incorporated in a communication system in which each of at least one transponder is operable, upon reception of a main carrier wave transmitted from the interrogator, to respond to the interrogator with a reflected wave that is generated by modulating the main carrier wave, the interrogator including: (a) a transmitting portion operable to transmit the main carrier wave; (b) a receiving portion operable to receive the reflected wave as a received signal; (c) a first frequency converting portion operable to generate an intermediate frequency signal, by multiplying the received signal with a first local signal that is generated by a first local oscillator; (d) a second frequency converting portion operable to generate a demodulated signal, by multiplying the intermediate frequency signal or a converted signal converted from the intermediate frequency signal, with a second local signal that is generated by a second local oscillator; and (e) a phase controlling portion operable to control phase of the second local signal.

In the interrogator constructed according to the invention, for example, by controlling the second local signal such that the second local signal coincides in phase with a desired wave and/or such that the second local signal is orthogonal to an interference wave, so as to make it possible to reduce main carrier component and interference wave component, thereby enabling a signal related to the modulation (performed by the transponder) and having a high signal-to-noise ratio, to be extracted. That is, the present invention provides the interrogator of the communication system that is capable of satisfactorily detecting a signal related to modulation performed by the transponder of the communication system.

According to the second aspect of the invention, in the interrogator defined in the first aspect of the invention, the phase controller controls the phase of the second local signal generated by the second local oscillator, such that a signal-to-noise ratio of the demodulated signal is increased. This arrangement makes it possible to remove the interference wave contained in the demodulated signal, and accordingly to extract the modulation-related signal having a high signal-to-noise ratio.

According to the third aspect of the invention, in the interrogator defined in the first aspect of the invention, the controller controls the phase of the second local signal generated by the second local oscillator, such that a signal-to-noise ratio of the demodulated signal is maximized. This arrangement makes it possible to remove the interference wave contained in the demodulated signal, and accordingly to extract the modulation-related signal having a maximized signal-to-noise ratio.

According to the fourth aspect of the invention, in the interrogator defined in any one of the first through third aspects of the invention, an analog-to-digital converter is provided to be interposed between the at least one first frequency-converter and the at least one second frequency-converter, wherein each of the at least one second frequency-converter generates the demodulated signal by a digital processing. This arrangement facilitates the phase controller to control the phase of the second local signal.

According to the fifth aspect of the invention, in the interrogator defined in any one of the first through fourth aspects of the invention, the phase controller controls the phase and frequency of the second local signal generated by the second local oscillator, based on one cycle of at least one periodic function that is previously determined. This arrangement makes it possible to reduce load imposed on the phase controller.

According to the sixth aspect of the invention, in the interrogator defined in the fifth aspect of the invention, the phase controller controls the second local signal generated by the second local oscillator, such that the generated second local signal corresponds to one of a plurality of second local signals which are previously determined and which are different from each other with respect to at least one of the phase and the frequency thereof. This arrangement enables the load imposed on the phase controller, to be reduced as much as possible.

According to the seventh aspect of the invention, in the interrogator defined in the fourth aspect of the invention, the phase controller controls the phase and frequency of the second local signal generated by the second local oscillator, based on one cycle of a periodic function that is previously calculated. This arrangement permits reduction in the load imposed on the phase controller, and also permits reduction in amount of data that is to be previously stored in, for example, a data storage.

According to the eighth aspect of the invention, in the interrogator defined in the seventh aspect of the invention, the phase controller controls the second local signal generated by the second local oscillator, such that the generated second local signal corresponds to one of a plurality of second local signals which are previously calculated and which are different from each other with respect to at least one of the phase and the frequency thereof. This arrangement enables the load imposed on the phase controller, to be reduced as much as possible, and also permits reduction in amount of data that is to be previously stored in, for example, a data storage.

According to the ninth aspect of the invention, in the interrogator defined in any one of the first through eighth aspects of the invention, the at least one second frequency-converter includes a plurality of second frequency-converters operable to generate respective demodulated signals, based on respective second local signals which are different from each other with respect to at least one of the phase and the frequency thereof. This arrangement makes it possible to generate each of the demodulated signals in a manner suitable, for example, for a distances between the interrogator and a corresponding one of the plurality of transponders.

According to the tenth aspect of the invention, in the interrogator defined in any one of the first through ninth aspects of the invention, the at least one second frequency-converter includes the same number of second frequency-converters as communication channels established in the communication system, wherein the second frequency-converters generate respective demodulated signals related to communications performed in the respective communication channels, based on respective second local signals which are different from each other with respect to at least one of the phase and the frequency thereof. In this arrangement, since there are provided the same number of second frequency-converters as the number of communication channels, i.e., as the maximum number of establishable communication lines, it is possible to most effectively utilize a communication area.

According to the eleventh aspect of the invention, in the interrogator defined in any one of the first through tenth aspects of the invention, the number of the at least one second frequency-converter is not larger than the number of communication channel established in the communication system, and is changeable depending upon the number of the at least one transponder. In this arrangement, it is possible to reduce load imposed on the interrogator, by preparing the necessary and sufficient number of second frequency-converters through a digital processing.

According to the twelfth aspect of the invention, in the interrogator defined in the fifth or sixth aspect of the invention, the number of the at least one second frequency-converter is the same as the number of the at least one periodic function. This arrangement makes it possible to simplify the phase control and to increase speed of the demodulation processing, by selecting a signal whose signal-to-noise ratio is not lower than a threshold value, in each of the necessary and sufficient number of second frequency-converters.

According to the thirteenth aspect of the invention, in the interrogator defined in any one of the first through twelfth aspects of the invention, each of the at least one second frequency-converter generates the demodulated signal through an orthogonal demodulation in which an input signal inputted to the second frequency-converter is converted into a complex signal including in-phase and quadrature-phase signals, wherein the phase controller controls the phase of the second local signal as the input signal, such that the quadrature-phase signal is minimized. In this arrangement in which the phase of the second local signal is controlled such that the quadrature-phase signal is minimized, it is possible to extract the modulation-related signal having a maximized signal-to-noise ratio, since where the transponder performs binary modulation, for example, in absence of the main carrier component, with either one of the in-phase and quadrature-phase signals being zeroed, the other of the in-phase and quadrature-phase signals is maximized.

According to the fourteenth aspect of the invention, in the interrogator defined in the fourth, seventh or eighth aspect of the invention, a sampling frequency of the analog-to-digital converter is at least four times as high as a frequency of the intermediate frequency signal. This arrangement enables the main carrier component of the intermediate frequency signal or the intermediate signal, to be more satisfactorily suppressed in the second frequency-converter.

According to the fifteenth aspect of the invention, in the interrogator defined in the fourth, seventh, eighth or fourteenth aspect of the invention, a sampling frequency of the analog-to-digital converter is determined based on a frequency of a main carrier component of the intermediate frequency signal. For example, where the sampling frequency is set to be about 0.8 times as high as the intermediate frequency, the analog-to-digital converter can be provided by a relatively inexpensive device, and by undersampling with the thus set sampling frequency, it is possible to convert the frequency of a signal that is received such that the carrier frequency is about 0.2 times as high as the intermediate frequency.

According to the sixteenth aspect of the invention, in the interrogator defined in any one of the first through fifteenth aspects of the invention, the transmitting portion includes: (a-1) a main carrier oscillator operable to generate the main carrier wave; (a-2) a divider operable to divide the main carrier wave into a transmission signal and a cancel signal; (a-3) a transmission signal amplifier operable to amplify the transmission signal; and (a-4) a transmitting antenna operable to transmit the transmission signal, wherein the receiving portion includes: (b-1) a receiving antenna operable to receive the reflected wave as the received signal; (b-2) a cancel-signal amplitude adjuster operable to adjust amplitude of the cancel signal; (b-3) a cancel-signal phase adjuster operable to adjust phase of the cancel signal; and (b-4) a combiner operable to combine the cancel signal and the received signal after the amplitude and phase of the cancel signal have been adjusted by the respective adjusters, and to output an output in the form of combination of the received signal and the cancel signal, and wherein the cancel-signal amplitude adjuster and the cancel-signal phase adjuster adjust the amplitude and phase of the cancel signal, respectively, such that the output of the combiner is reduced. This arrangement, by suppressing the main carrier component of the reflected wave as the received signal before the frequency conversion performed by the first frequency-converter, makes it possible to extract the modulation-related signal having a maximized signal-to-noise ratio.

According to the seventeenth aspect of the invention, in the interrogator defined in any one of the first through fifteenth aspects of the invention, a transmitting and receiving antenna is provided to transmit the main carrier wave and receive the reflected wave as the received signal, wherein the transmitting portion includes: (a-1) a main carrier oscillator operable to generate the main carrier wave; (a-2) a divider operable to divide the main carrier wave into a transmission signal and a cancel signal; (a-3) a transmission signal amplifier operable to amplify the transmission signal; and (a-4) a separator operable to supply the amplified transmission signal to the transmitting and receiving antenna and to supply the received signal to the receiving portion, wherein the receiving portion includes: (b-1) a cancel-signal amplitude adjuster operable to adjust amplitude of the cancel signal; (b-2) a cancel-signal phase adjuster operable to adjust phase of the cancel signal; and (b-3) a combiner operable to combine the cancel signal and the received signal after the amplitude and phase of the cancel signal have been adjusted by the respective adjusters, and to output an output in the form of combination of the received signal and the cancel signal, and wherein the cancel-signal amplitude adjuster and the cancel-signal phase adjuster adjust the amplitude and phase of the cancel signal, respectively, such that the output of the combiner is reduced. In this arrangement, since the transmission of the main carrier wave and the reception of the reflected wave are both performed by the transmitting and receiving antenna, the interrogator can be made compact in size.

According to the eighteenth aspect of the invention, in the interrogator defined in any one of the first through seventeenth aspects of the invention, a main carrier oscillator is provided to generate the main carrier wave, and a reference frequency generator is provided to generate a reference frequency, wherein the main carrier oscillator and the first local oscillator generate the main carrier wave and the first local signal, respectively, based on the reference frequency. In this arrangement in which the reference frequency is used as a common frequency for both of the generation of main carrier wave and the generation of the first local signal, it is possible to reduce possibility of fluctuation of the frequency of the intermediate frequency signal. Further, where the used reference frequency generator is provided by a device with high precision, it is possible to obtain the main carrier wave and intermediate frequency signal having high accuracy with respect to their frequencies, thereby increasing accuracy of the demodulation processing.

According to the nineteenth aspect of the invention, in the interrogator defined in any one of the first through eighteenth aspects of the invention, a main carrier oscillator is provided to generate the main carrier wave; a cancel signal mixer is provided to generate a cancel signal, by multiplying the main carrier wave with the first local signal; a cancel-signal amplitude adjuster is provided to adjust amplitude of the cancel signal; a cancel-signal phase adjuster is provided to adjust phase of the cancel signal; and a combiner is provided to combine the cancel signal and the intermediate frequency signal after the amplitude and phase of the cancel signal have been adjusted by the respective adjusters, and to output an output in the form of combination of the cancel signal and the intermediate frequency signal, wherein the cancel-signal amplitude adjuster and the cancel-signal phase adjuster adjust the amplitude and phase of the cancel signal, respectively, such that the output of the combiner is reduced. This arrangement, by suppressing the main carrier component of the intermediate frequency signal or the intermediate signal (as the converted signal converted from the intermediate frequency signal) before the frequency conversion performed by the second frequency-converter, makes it possible to extract the modulation-related signal having a maximized signal-to-noise ratio.

According to an advantageous arrangement of the nineteenth aspect of the invention, a frequency divider is provided to generate a frequency-divided signal, by frequency-dividing the cancel signal with a frequency division ratio of 0.2; and a clock signal mixer is provided to generate a clock signal, by multiplying the frequency-divided signal with the cancel signal, such that the generated clock signal serves as a clock of the analog-to-digital converter. In this arrangement in which a sampling signal of the analog-to-digital converter is generated based on the main carrier wave, it is possible to reduce possibility of error caused by difference between the main carrier wave and sampling cycle.

According to the twentieth aspect of the invention, in the interrogator defined in the fourth, seventh, eighth, fourteenth or fifteenth aspect of the invention, a main carrier oscillator is provided to generate the main carrier wave; an intermediate-frequency signal mixer is provided to generate an intermediate frequency signal, by multiplying the main carrier wave with the first local signal; a frequency divider is provided to generate a frequency-divided signal, by frequency-dividing the intermediate frequency signal; and a clock signal mixer is provided to generate a clock signal, by multiplying the frequency-divided signal with the intermediate frequency signal, such that the generated clock signal serves as a clock of the analog-to-digital converter. In this arrangement in which the clock signal of the analog-to-digital converter is generated based on the main carrier wave, it is possible to reduce possibility of error caused by difference between the main carrier wave and sampling cycle.

According to the twentieth-first aspect of the invention, in the interrogator defined in the twentieth aspect of the invention, the frequency divider generates the frequency-divided signal, by frequency-dividing the intermediate frequency signal with a frequency division ratio of 0.2. This arrangement makes it possible to advantageously generate the clock signal of the analog-to-digital converter, based on the main carrier wave.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which:

FIG. 20 is a view showing a cosine wave table as an example of a periodic function table provided in the interrogator of FIG. 19;

FIG. 21 is a view showing a sine wave table as an example of the periodic function table provided in the interrogator of FIG. 19;

DETAILED DESCRIPTION OF THE PREFERRED EMBODIMENTS

There will be described in detail some embodiments of this invention, referring to the accompanying drawings.

First Embodiment

Figure 1:
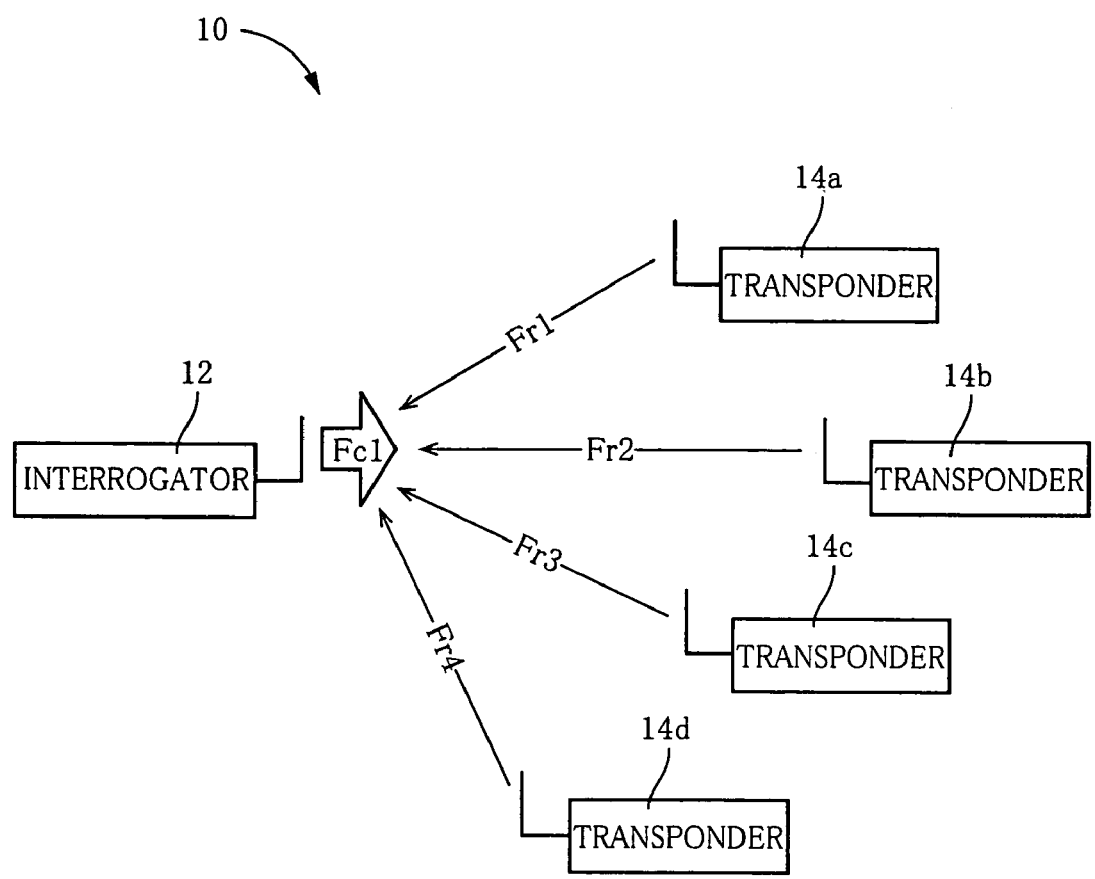
FIG. 1 is a view showing a basic arrangement of a communication system to which the present invention is applicable.

Referring first to FIG. 1, there is shown a communication system 10 to which the present invention is advantageously applied. This communication system 10 includes an interrogator 12 that is constructed according to a first embodiment of the invention, and a plurality of (e.g., a total of four) transponders 14a, 14b, 14c, 14d (which will be referred simply to as transponders 14 where they do not have to be particularly distinguished from each other). The interrogator 12 is operable to transmit an interrogating wave in the form of a main carrier wave $F_{c1}$ toward the transponders 14. The transponders 14a, 14b, 14c, 14d are operable, upon reception of the main carrier wave $F_{c1}$ transmitted from the interrogator 12, to respond to the interrogator 12 with response waves in the form of a reflected wave $F_{r1}$, a reflected wave $F_{r2}$, a reflected wave $F_{r3}$ and a reflected wave $F_{r4}$, respectively. That is, in the transponder 14a, the reflected wave $F_{r1}$ is generated by secondarily modulating the main carrier wave $F_{c1}$ by a subcarrier signal $f_{sc1}$ that is primarily modulated by a predetermined information signal (data), so that the transponder 14a responds to the interrogator 12 with the thus generated reflected wave $F_{r1}$. Similarly, in the transponders 14b, 14c, 14d, the reflected waves $F_{r2}$, $F_{r3}$, $F_{r4}$ (which will be referred simply to as reflected waves $F_{rf}$ where they do not have to be particularly distinguished from each other) are generated, so that the transponders 14b, 14c, 14d respond to the interrogator 12 with the respective reflected waves $F_{r2}$, $F_{r3}$, $F_{r4}$.

Figure 2:
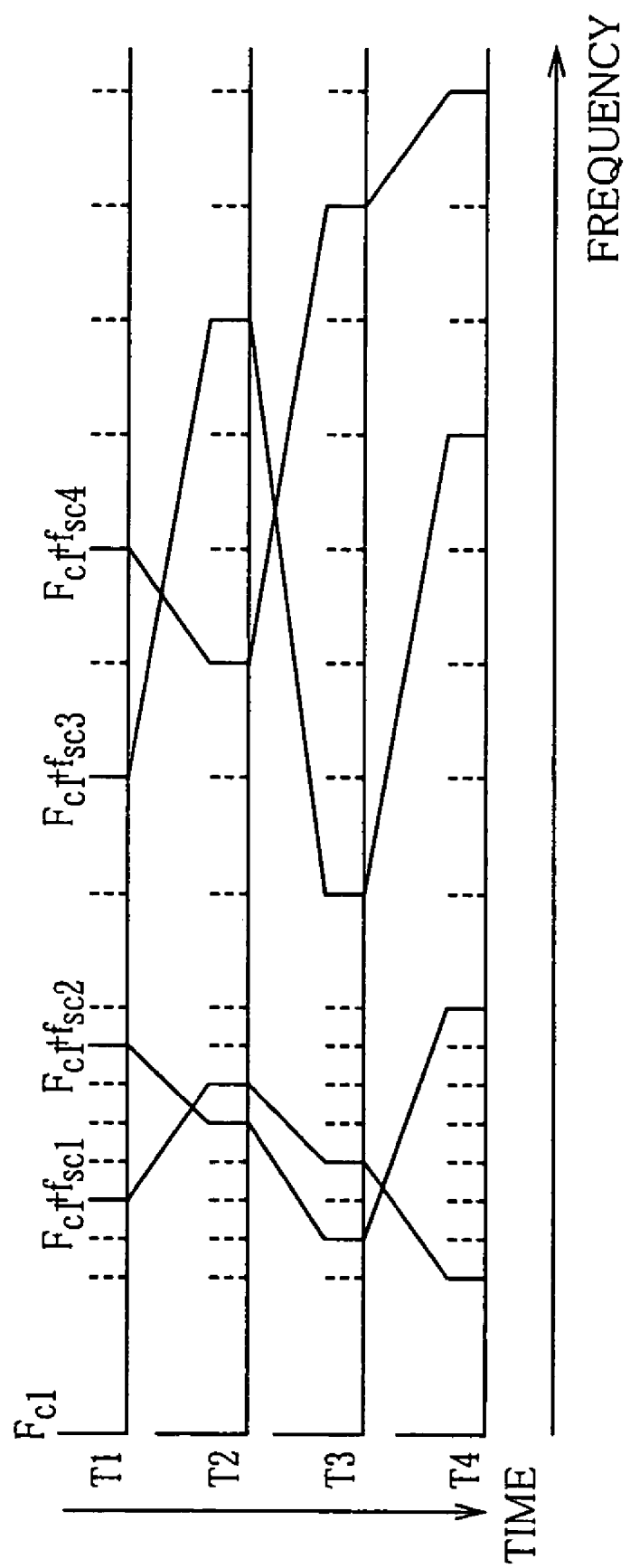
FIG. 2 is a graph showing a relationship between a main carrier wave and a reflected wave that are used in the communication system of FIG. 1.

FIG. 2 is a graph showing a relationship between the main carrier wave and the reflected wave that are used in the communication system 10. The frequency of the subcarrier signal in each of the transponders 14 is hopped, preferably, in a manner that varies from transponder to transponder. In the transponders 14a-14d, there are generated sideband signals represented by $F_{c1} \pm f_{sc1}$, $F_{c1} \pm f_{sc2}$, $F_{c1} \pm f_{sc3}$, $F_{c1} \pm f_{sc4}$, for example. As shown in FIG. 2, at a point T1 of time, the frequency of $F_{c1} \pm f_{sc1}$ is the lowest, the frequency of $F_{c1} \pm f_{sc2}$ is the second lowest, the frequency of $F_{c1} \pm f_{sc3}$ is the second highest, and the frequency of $F_{c1} \pm f_{sc4}$ is the highest. At a point T2 of time, the frequency of $F_{c1} \pm f_{sc2}$ is the lowest, the frequency of $F_{c1} \pm f_{sc1}$ is the second lowest, the frequency of $F_{c1} \pm f_{sc4}$ is the second highest, and the frequency of $F_{c1} \pm f_{sc3}$ is the highest. Thus, the order of the sideband signals with respect to the frequency is randomly changed with the elapse of time. That is, the frequencies of the reflected waves $F_{r1}$-$F_{r4}$ transmitted from the respective transponders 14a-14d are hopped based on pseudorandom sequence, thereby reducing possibility of collision of the reflected waves with each other. The reduction in the possibility of the collision enables the signals contained in the respective reflected waves $F_{r1}$-$F_{r4}$ and related to the respective modulations, to be extracted independently of each other.

Figure 3:
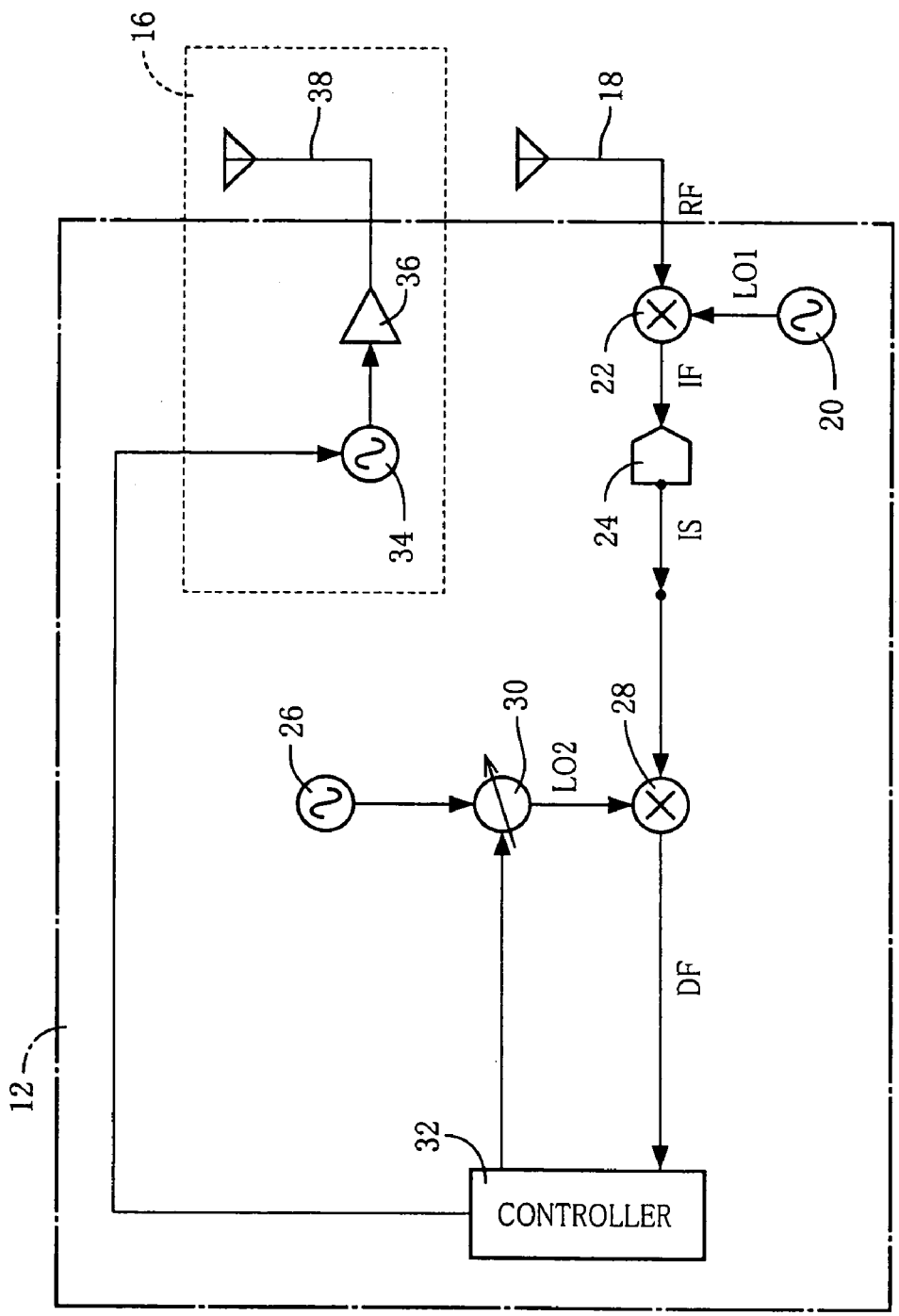
FIG. 3 is a view showing an arrangement of an interrogator of the communication system of FIG. 1, which is constructed according to a first embodiment of the invention.

FIG. 3 is a view showing an arrangement of the interrogator 12. As shown in FIG. 3, the interrogator 12 includes: a transmitting portion 16 operable to transmit the main carrier wave $F_{c1}$; a receiving antenna 18 serving as a receiving portion operable to receive each of the reflected waves $F_{r1}$-$F_{r4}$ as a received signal RF; a first mixer 22 serving as a first frequency converting portion operable to generate an intermediate frequency signal IF, by multiplying the received signal RF with a first local signal LO1 that is generated by a first local oscillator 20; an analog-to-digital converter (A/D converter) 24 which is provided, as needed, to be interposed between the first and second mixers 22, 28 and which is operable to convert an analog signal in the form of the intermediate frequency signal IF (generated by the first mixer 22), into a digital signal in the form of an intermediate signal IS; the second mixer 28 serving as a second frequency converting portion operable to generate a demodulated signal DF, by multiplying the intermediate frequency signal IF (generated by the first mixer 22) or the intermediate signal IS (to which the intermediate frequency signal IF is converted by the A/D converter 24), with a second local signal LO2 that is generated by a second local oscillator 26; a phase controller 30 operable to control phase of the second local signal LO2 (generated by the second local oscillator 26); and a main controller 32 operable to control an operation of the interrogator 12. The transmitting portion 16 includes: a main carrier oscillator 34 operable to generate the main carrier wave $F_{c1}$; an amplifier 36 serving as a transmission signal amplifying portion operable to electrically amplify the main carrier wave $F_{c1}$ (transmission signal) generated by the main carrier oscillator 34; and an transmitting antenna 38 operable to transmit the main carrier wave $F_{c1}$ that is amplified by the amplifier 36.

Figure 4:
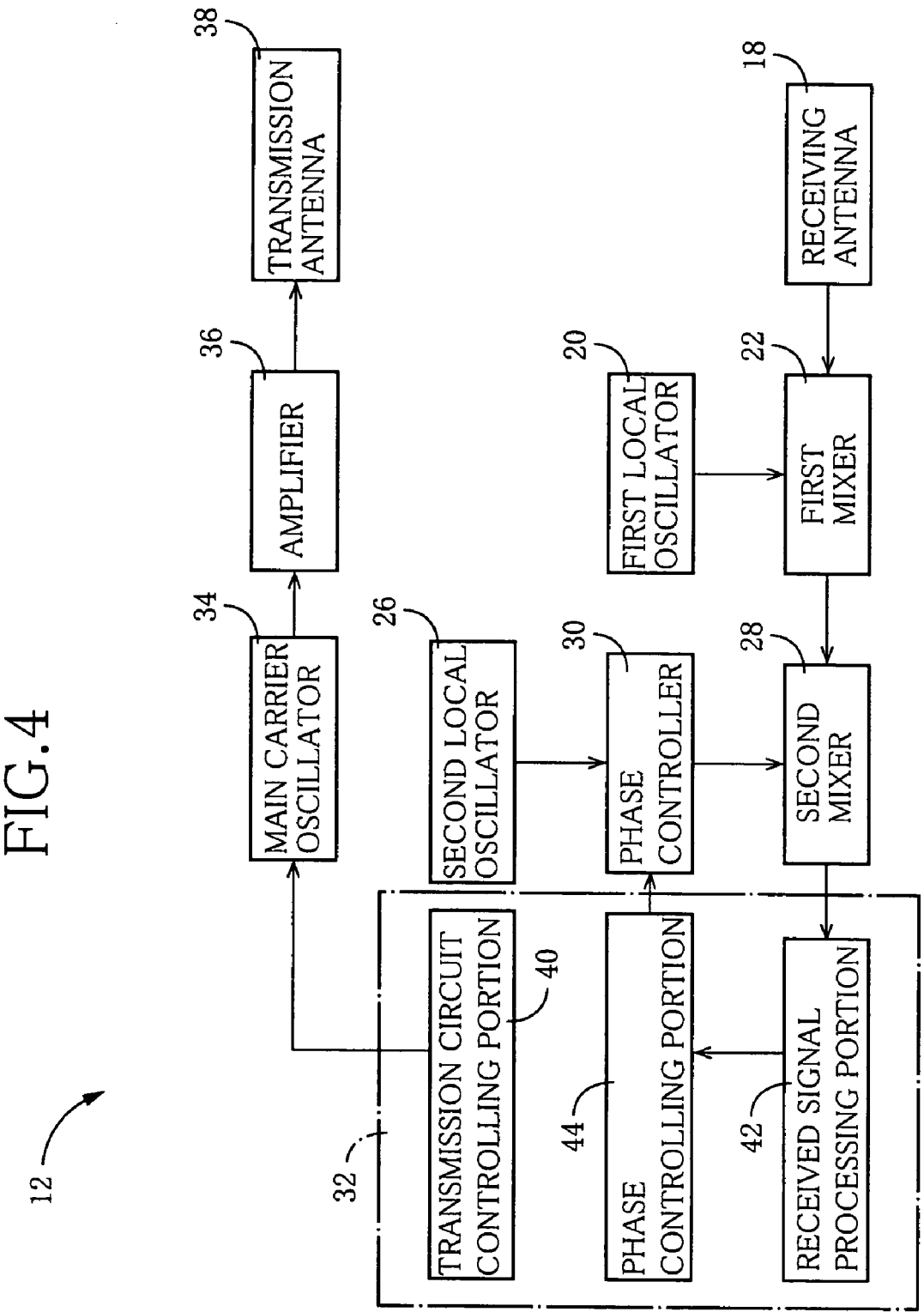
FIG. 4 is a block diagram showing an arrangement of a controller that is provided in the interrogator of FIG. 3.

FIG. 4 is a block diagram showing an arrangement of the main controller 32. The main controller 32 is a so-called microcomputer which incorporates, for example, CPU, ROM and RAM, and which operates to perform signal processing operations according to programs stored in the ROM, while utilizing a temporary data storage function of the RAM. As shown in FIG. 4, the main controller 32 includes a transmission circuit controlling portion 40, a received signal processing portion 42 and a phase controlling portion 44. The transmission circuit controlling portion 40 is assigned to control an operation of the main carrier oscillator 34 to generate the main carrier wave $F_{c1}$ having frequency of about 915 MHz. The received signal processing portion 42 is assigned, for example, to detect the modulation-related signal (that is related to the modulation performed by the transponder 14) from the subcarrier signal, after extracting the subcarrier signal by converting the demodulated signal DF (generated by the second frequency converting portion, i.e., the second mixer 28) in a time series manner. The phase controlling portion 44 is assigned to cause the above-described phase controller 30 to control phase of the second local signal LO2 (generated by the second local oscillator 26) such that the phase of the second local signal LO2 coincides with the phase of a main carrier component of the intermediate frequency signal IF or intermediate signal IS. In this instance, the phase of the second local signal LO2 is controlled, preferably, such that a signal-to-noise ratio S/N of the demodulated signal DF (that is inputted to the main controller 32) is increased, more preferably, such that the signal-to-noise ratio S/N of the demodulated signal DF is maximized. The signal-to-noise ratio S/N is an example of a ratio of a desired frequency to a particular frequency that is other than the desired frequency. For example, the phase of the second local signal LO2 may be controlled such that a signal-to-interference ratio S/I of the demodulated signal is increased or maximized.

Preferably, the second mixer 28 is arranged to generate the demodulated signal DF through so-called IQ orthogonal demodulation, namely, is arranged to, after converting a signal inputted thereto into a complex signal consisting of in-phase and quadrature-phase signals that are different in phase by 90°, generate the demodulated signal DF through a demodulation processing using the complex signal. The phase controlling portion 44 of the main controller 32 causes the phase controller 30 to control the phase of the second local signal LO2 such that the quadrature-phase signal is minimized or zeroed. In this arrangement in which the phase of the second local signal LO2 such that the quadrature-phase signal is minimized, it is possible to extract the modulation-related signal having a maximized signal-to-noise ratio S/N, since where the transponder 14 performs binary modulation, for example, in absence of the main carrier component, with either one of the in-phase and quadrature-phase signals being zeroed, the other of the in-phase and quadrature-phase signals is maximized.

Figure 5:
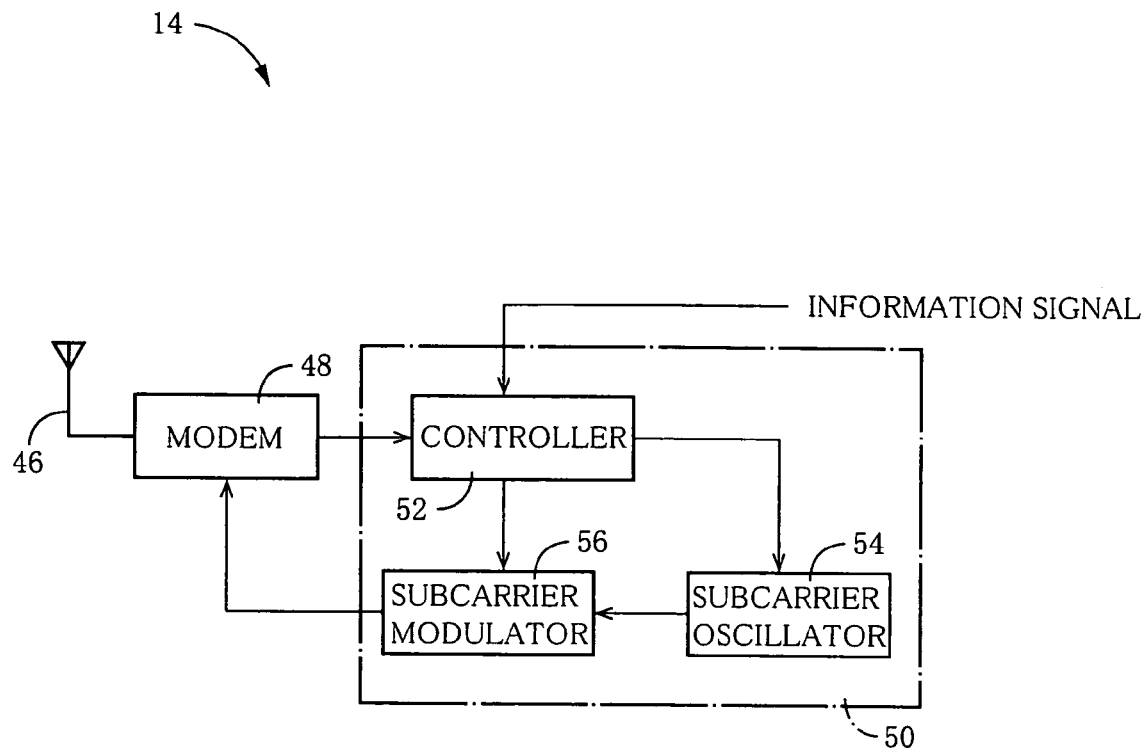
FIG. 5 is a block diagram showing an arrangement of a transponder of the communication system of FIG. 1.
Figure 6:
FIG. 6 is a view showing a modulation-related signal generated in the transponder of FIG. 5.

FIG. 5 is a block diagram showing an arrangement of the transponder 14. As shown in FIG. 5, the transponder 14 includes: a MODEM (modulator/demodulator) 48 that is connected to an antenna 46; and a digital circuit 50. The digital circuit 50 includes a controller 52 operable to control an operation of the transponder 14; a subcarrier oscillator 54 operable to generate the subcarrier wave; and a subcarrier modulator 56 operable to modulate (primarily modulate) the subcarrier wave (generated by the subcarrier oscillator 54), based on the information signal inputted via the controller 52, by, for example, PSK (phase shifting keying). The subcarrier wave modulated by the subcarrier modulator 56 is inputted to the MODEM 48, so that the main carrier wave $F_{c1}$ transmitted from the interrogator 12 is modulated (secondarily modulated) with the subcarrier wave inputted to the MODEM 48, and the thus modulated main carrier wave $F_{c1}$ as the reflected wave $F_{rf}$ is transmitted from the antenna 46.

There will be next described a communication operation performed by the communication system 10 that is constructed as described above. FIGS. 6-17 are views showing states of signals in portions of the interrogator 12 and transponder 14. First, in the interrogator 12, the main carrier wave $F_{c1}$ having the frequency of about 915 MHz is generated by the main carrier oscillator 34, and is then transmitted from the transmitting antenna 38 after being amplified by the amplifier 36.

Figure 7:
FIG. 7 is a view showing a subcarrier wave obtained based on the signal of FIG. 6.
Figure 8:
FIG. 8 is a view showing a modulation-related signal generated in the transponder of FIG. 5.
Figure 9:
FIG. 9 is a view showing a subcarrier wave obtained based on the signal of FIG. 8.
Figure 10:
FIG. 10 is a view showing frequencies of the subcarrier waves of FIGS. 7 and 9 at a certain point of time.
Figure 11:
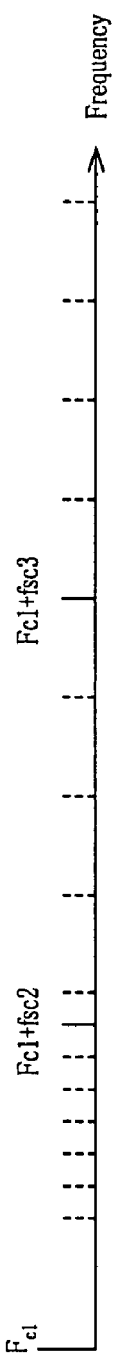
FIG. 11 is a view showing frequencies of the reflected waves at a certain point of time.

Next, in the transponder 14 having received the main carrier wave $F_{c1}$ from the interrogator 12, the subcarrier wave is generated by the subcarrier oscillator 54. The generated subcarrier is phase-modulated by the subcarrier modulator 56, for example, based on a signal shown in FIG. 6, so as to take a waveform as shown in FIG. 7. Alternatively, the generated subcarrier is phase-modulated by the subcarrier modulator 56, for example, based on a signal shown in FIG. 8, so as to take a waveform as shown in FIG. 9. The thus modulated subcarrier waves $F_{sc2}$ (see FIG. 7), $F_{sc3}$ (see FIG. 9) are applied to the MODEM 48. FIG. 10 is a view showing the frequencies of the respective subcarrier waves $F_{sc2}$, $F_{sc3}$ at a certain point of time. In the MODEM 48, the main carrier wave $F_{c1}$ transmitted from the interrogator 12 is modulated by the subcarrier waves $F_{sc2}$, $F_{sc3}$, so that the reflected waves $F_{c1}+f_{sc2}$, $F_{c1}+f_{sc3}$ having respective spectrums as shown in FIG. 11 are transmitted as the response waves from the antenna 46. It is noted that a sideband located on an upper side of the frequency $F_{c1}$ is illustrated in FIG. 11 while another sideband located on a lower side of the frequency $F_{c1}$ is not illustrated in FIG. 11.

Figure 12:
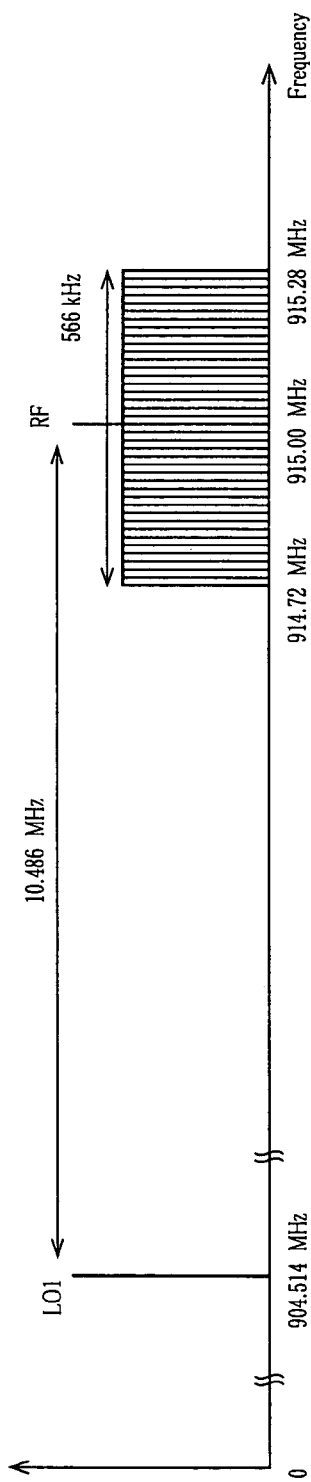
FIG. 12 is a view showing a received signal (reflected wave) inputted to a first frequency-converter in the interrogator.
Figure 13:
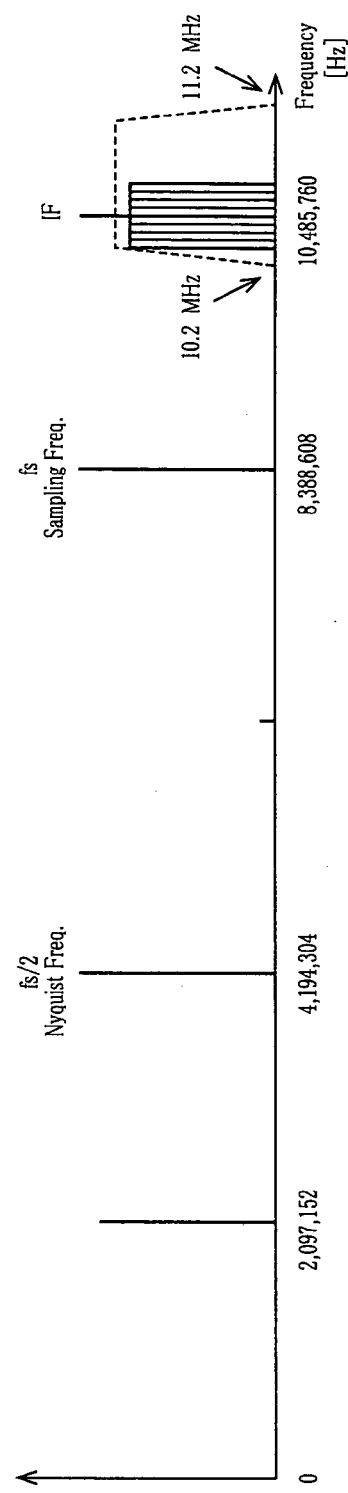
FIG. 13 is a view showing an intermediate frequency signal outputted from the first frequency-converter in the interrogator.

Next, in the interrogator 12 having received the reflected waves $F_{r1}+f_{sc2}$, $F_{r1}+f_{sc3}$ transmitted from the transponder 14, a heterodyne demodulation is performed by each of the first and second mixers 22, 28. FIG. 12 is a view showing a signal that is inputted to the first frequency-converter, i.e., the first mixer 22. FIG. 13 is a view showing a signal that is outputted from the first mixer 22 after being subjected to the frequency conversion performed by the first mixer 22. In the first mixer 22, as shown in FIGS. 12 and 13, the received signal RF (received by the antenna 18 and having the frequency of about 915 MHz) is multiplied with the first local signal LO1 (generated by the first local oscillator 20 and having the frequency of about 904 MHz), whereby the intermediate frequency signal IF having the frequency of about 10.48 MHz (10,480,000 Hz) is generated.

Figure 14:
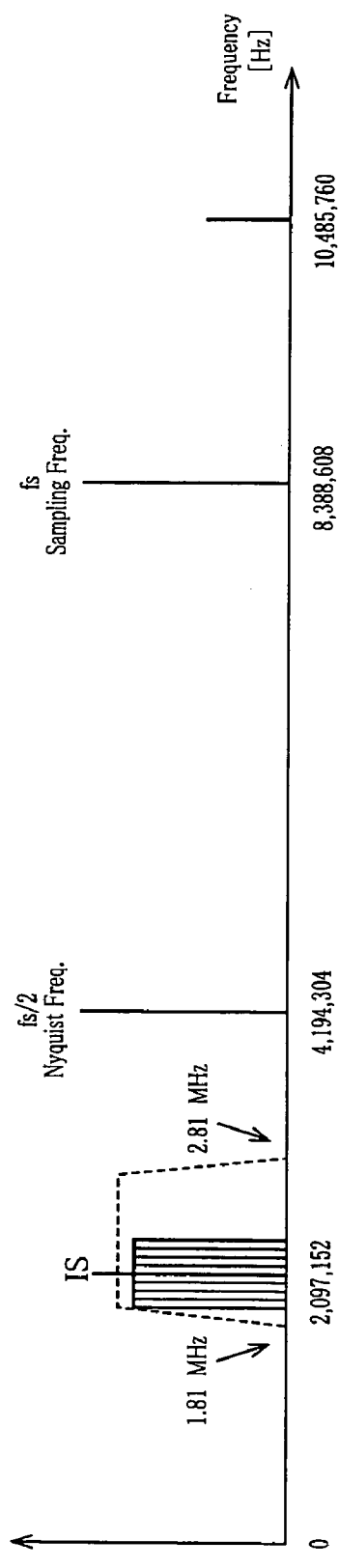
FIG. 14 is a view showing an intermediate signal outputted from an analog-to-digital converter in the interrogator.

Next, in the A/D converter 24, the analog signal in the form of the intermediate frequency signal IF generated by the first mixer 22 is converted into the digital signal in the form of the intermediated signal IS. FIG. 14 is a view showing the intermediate signal IS outputted from the A/D converter 24. As shown in FIG. 14, a sampling frequency fs of the A/D converter 24 is determined, preferably, such that the sampling frequency fs is about 8.4 MHz (8,400,000 Hz), i.e., about 0.8 times as high as the frequency of the main carrier wave component of the intermediate frequency IF. By undersampling with the thus determined sampling frequency fs, there is generated the intermediate signal IS having the frequency of about 2.1 MHz (2,100,000 Hz), i.e., about 0.2 times as high as the frequency of the main carrier wave component of the intermediate frequency signal IF. It is preferable that the sampling frequency fs is determined to be at least four times as high as the frequency of the intermediate frequency signal IF. It is more preferable that the sampling frequency fs is set to be integer number times as high as the intermediate frequency signal IF, so as to make it possible to simplify the periodic function table.

Figure 15:
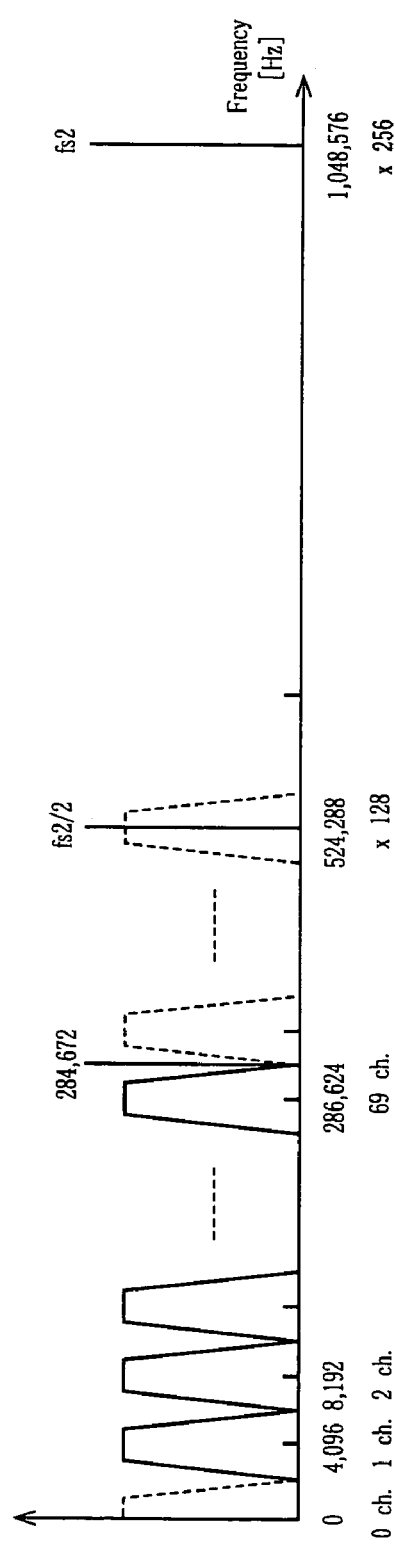
FIG. 15 is a view showing a demodulated signal outputted from a second frequency-converter in the interrogator.
Figure 16:
FIG. 16 is a view showing a subcarrier wave extracted from the demodulated signal and representing the same information represented by the signal of FIG. 6.
Figure 17:
FIG. 17 is a view showing a subcarrier wave extracted from the demodulated signal and representing the same information represented by the signal of FIG. 8.

Next, in the second mixer 28, the intermediate signal IS (as the converted signal converted by the A/D converter 24) is multiplied with the second local signal LO2 generated by the second local oscillator 26 and having the frequency of about 2.1 MHz, whereby the demodulated signal DF is generated. FIG. 15 is a view showing the demodulated signal DF as an output signal of the second frequency-converter, i.e., the second mixer 28. As shown in FIG. 15, there is thus obtained the demodulated signal DF in which the reflected waves $F_{rf}$ transmitted from the respective transponders 14, i.e., a plurality of subcarrier wave signals (communication channels) mixedly exist. In the main controller 32, the demodulated signal DF is subjected to, for example, a filtering processing using Fourier transform, so as to be divided into a plurality of signals corresponding to the respective subcarrier wave signals, and then the divided signals are subjected to inverse Fourier transform so as to be converted in a time series manner whereby the converted signals are extracted as a subcarrier wave signal that is modulated, for example, as shown in FIG. 16 corresponding to FIG. 7. From the subcarrier wave signal, the same information signal as that shown in FIG. 6 can be detected. Or, as a result of the inverse Fourier transform, the converted signals are extracted as a subcarrier wave signal that is modulated as shown in FIG. 17 corresponding to FIG. 9, and the same information signal as that shown in FIG. 8 can be detected from the subcarrier wave signal.

Figure 18:
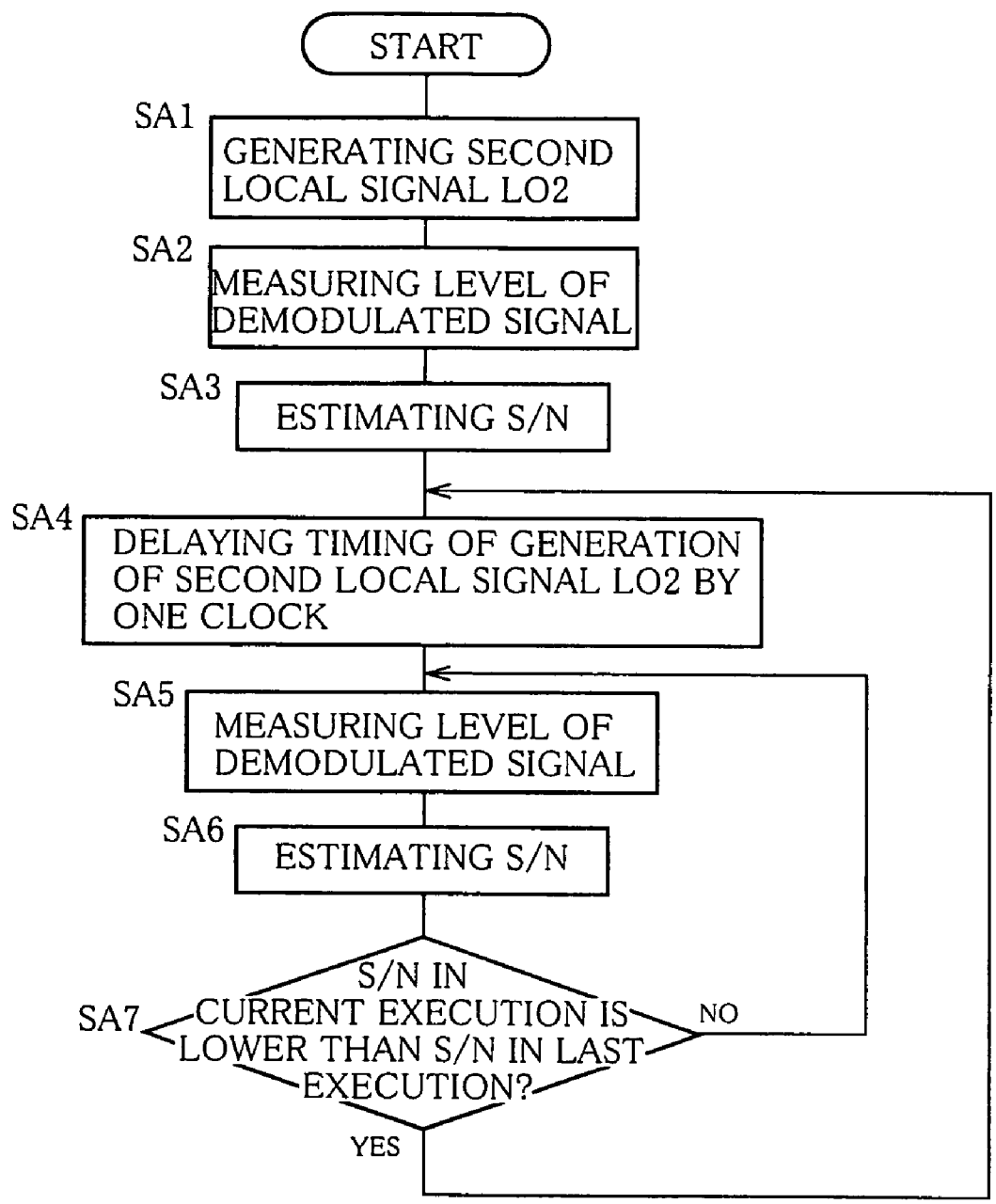
FIG. 18 is a flow chart illustrating a main portion of a phase control routine executed by a controller of FIG. 3, for controlling phase of a second local signal.

In generation of the demodulated signal DF by the second mixer 28, the phase of the second local signal LO2 is controlled by the phase controller 30. FIG. 18 is a flow chart illustrating a main portion of a phase control routine executed by the main controller 32 to cause the phase controller 30 to control the phase of the second local signal LO2. This routine is executed repeatedly with an extremely short cycle time ranging from several msec to several tens msec.

The routine is initiated with step SA1 in which the second local signal LO2 is generated by the second local oscillator 26. Step SA1 is followed by step SA2 that is implemented to measure a signal level of the demodulated signal DF outputted from the second mixer 28. Step SA3 is then implemented to estimate the signal-to-noise ratio S/N of the demodulated signal DF, based on the signal level measured in step SA2. Next, in step SA4 that is implemented by the phase controlling portion 44 of the main controller 32, the phase of the second local signal LO2 is controlled by the phase controller 30 such that a point of time at which generation of the second local signal LO2 by the second local oscillator 26 is delayed by one clock. Step SA5 is then implemented to measure the signal level of the demodulated signal DF outputted from the second mixer 28, like step SA2. Next, step SA6 is implemented to estimate the signal-to-noise ratio S/N of the demodulated signal DF, based on the signal level measured in step SA5, like step SA3. Step SA6 is followed by step SA7 that is implemented to determine whether a value of the signal-to-noise ratio S/N estimated in the current execution of the routine is lower than a value of the signal-to-noise ratio S/N estimated in the last execution of the routine. If an affirmative decision is obtained in the determination of step SA7, the control flow goes to step SA4 so that step SA4 and the subsequent steps are implemented again. If a negative decision is obtained in the determination of step SA7, the control flow goes to step SA5 so that step SA5 and the subsequent steps are implemented again. In the phase control routine, steps SA2, SA3, SA5, SA6 and SA7 are implemented by the phase controlling portion 42 of the main controller 32.

As is clear from the above description, the interrogator 12 constructed according to the present first embodiment of the invention includes: the transmitting portion 16 operable to transmit the main carrier wave $F_{c1}$; the receiving antenna 18 serving as the receiving portion operable to receive the reflected wave $F_{rf}$ as the received signal RF; the first mixer 22 serving as the first frequency-converter operable to generate the intermediate frequency signal IF, by multiplying the received signal RF with the first local signal LO1 that is generated by the first local oscillator 20; the second mixer 28 serving as the second frequency-converter operable to generate the demodulated signal DF, by multiplying the intermediate frequency signal IF (generated by the first mixer 22) or the intermediate signal IS (as the converted signal converted from the intermediate frequency signal IF), with the second local signal (LO2) that is generated by the second local oscillator 26; and the phase controller 30 operable to control the phase of the second local signal LO2 generated by the second local oscillator 26. This arrangement enables the phase of the second local signal LO2 to be controlled to coincide with the phase of the main carrier component of the intermediate frequency signal IF or intermediate signal IS, thereby making it possible to extract the modulation-related signal having a high signal-to-noise ratio S/N. That is, the present invention can provide the interrogator 12 of the communication system 10 capable of satisfactorily detecting the signal related to the modulation performed by the transponder 14.

Such an improvement in performance of detection of the signal related to the modulation performed by the transponder 14 enables a reliable detection of the modulation-related signal even where the communication distance is relatively large, thereby making it possible to remarkably increase a communicable range of the communication system 10. Further, even when the transponder 14 is being moved, the reliable detection of the modulation-related signal can be maintained, for example, by an arrangement in which the phase of the second local signal LO2 is updated to be a more optimum value.

Since the phase controller 30 is arranged to control the phase of the second local signal LO2 generated by the second local oscillator 26 such that the signal-to-noise ratio S/N of the demodulated signal DF is increased, it is possible to remove the noise and interference wave contained in the demodulated signal DF, and accordingly to extract the modulation-related signal having the high signal-to-noise ratio S/N.

Since the phase controller 30 is arranged to control the phase of the second local signal LO2 generated by the second local oscillator 26 such that the signal-to-noise ratio S/N of the demodulated signal DF is maximized, it is possible to remove the interference wave contained in the demodulated signal DF, and accordingly to extract the modulation-related signal having the maximized signal-to-noise ratio S/N.

The A/D converter 24 is interposed between the first and second mixers 22, 28, and the second mixer 28 is arranged to generate the demodulated signal DF by a digital processing. This arrangement facilitates the phase controller 30 to control the phase of the second local signal LO2.

The second mixer 28 is arranged to generate the demodulated signal DF through the IQ orthogonal demodulation, wherein the phase controller 30 controls the phase of the second local signal LO2 generated by the second local oscillator 26, such that the quadrature-phase signal is minimized, thereby making it possible to extract the modulation-related signal having a maximized signal-to-noise ratio.

Since the sampling frequency fs of the A/D converter 24 is set to be at least four times as high as the frequency of the intermediate frequency signal IF, an accurate detection of the phase of the intermediate frequency signal IF or the intermediate signal IS can be made in the second mixer 28, making it possible to extract the modulation-related signal having the maximized signal-to-noise ratio S/N.

Since the sampling frequency fs of the A/D converter 24 is set to be about 0.8 times as high as the frequency of the main carrier wave component of the intermediate frequency IF, the A/D converter 24 may be provided by a relatively inexpensive device. By undersampling with the thus set sampling frequency fs, it is possible to generate the signal whose frequency is 0.2 times as high as the frequency of the main carrier wave component of the intermediate frequency IF.

Second Embodiment

Referring next to FIGS. 19-22, there will be described an interrogator 60 that is constructed according to a second embodiment of the invention. In the following description of the second embodiment, the same reference signs as used in the above-described first embodiment will be used to identify the functionally corresponding elements.

Figure 19:
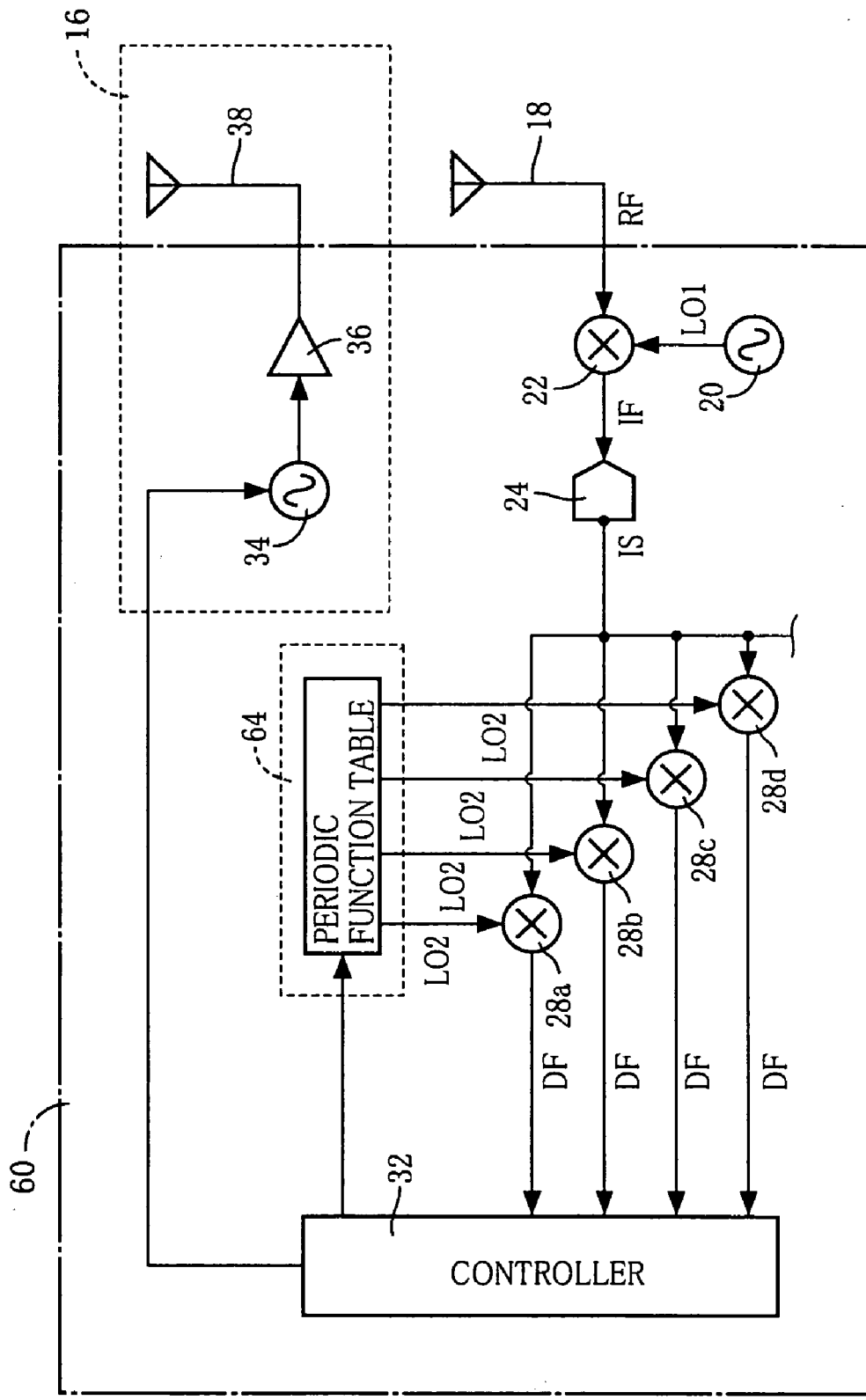
FIG. 19 is a view showing an arrangement of an interrogator, which is constructed according to a second embodiment of the invention.

As shown in FIG. 19, in the interrogator 60, the same number of intermediate signals IS as that of the communication channels are prepared as digital signals outputted from the A/D converter 24. The interrogator 60 includes a plurality of second frequency-converters in the form of the same number of second mixers 28a, 28b, 28c, . . . as that of the communication channels. The plurality of second mixers 28a, 28b, 28c, . . . are operable to generate respective demodulated signals DF, by multiplying the respective intermediate signals IS with respective second local signals LO2 that are different from each other with respect to the frequency and/or phase. A phase controller 64 is provided to generate the second local signals LO2 as digital signals, based on one cycle of a predetermined periodic function, and to supply the generated second local signals LO2 to the respective second mixers 28. That is, in the interrogator 60, the phase controller 64 serves also as the second local oscillator operable to generate the second local signals LO2.

The phase controller 64 preferably includes, as the one cycle of the periodic function, a cosine wave table 66 as shown in FIG. 20 or a sine wave table 68 as shown in FIG. 21, which are stored in a data storage thereof. In each of FIGS. 20 and 21, "0" indicates a point at which the sampling is effected in each one cycle corresponding to 360°, while "dθ" indicates a value corresponding to a phase difference from the main carrier component of the intermediate signal IS. That is, each of the tables 66, 68 is a table for comparing cases in each of which the sampling is effected four times per cycle, with the sampling frequency that is four times as high as the frequency of the intermediate signal IS. The compared cases are different with respect to the phase difference dθ that is selected from among 0°, 15°, 30°, 45°, 60°, 75°, . . . , 150°, 165°. The phase controller 64 generates the second local signal LO2, based on the cosine or sine wave corresponding to a selected one of the values of the phase difference dθ that are indicated in a corresponding one of the tables of FIGS. 20 and 21. In general, since the main carrier wave $F_{C1}$ generated by the main carrier oscillator 34 is provided by cosine or sine wave, it is possible to generate the second local signal SO2 whose phase coincides with the phase of the main carrier component of the intermediate signal IS, by selecting a suitable one of the values of the phase difference dθ. Thus, the modulation-related signal having a maximized signal-to-noise ratio S/N can be extracted. It is noted that each of the periodic function tables does not have to be necessarily provided by a table previously stored in the data storage, but may be provided by a table that is calculated as needed by, for example, the main controller 32. Further, while each of FIGS. 20 and 21 shows the table for generating the most simplified cosine or sine wave, it is preferable to use a periodic function representing each of the plurality of second local signals LO2 as such, which are different from each other with respect to the frequency and/or phase.

The main controller 32 of the interrogator 60 has the same control functions as shown in FIG. 4, including the transmission circuit controlling portion 40, received signal processing portion 42 and phase controlling portion 44. In the present second embodiment, the phase controlling portion 44 is arranged to cause the phase controller 64 to generate the second local signals LO2 each based on the cosine or sine wave having a selected one of the phase differences dθ shown in the periodic function, such that the generated second local signals LO2 are supplied to the respective second mixers 28. Preferably, the above-described selected one of the phase differences dθ is changed successively, whereby each of the second local signals LO2 having the changeable phase difference dθ is supplied to a corresponding one of the second mixers 28, so that the phase difference dθ that increases as much as possible or maximizes the signal-to-noise ratio S/N of the demodulated signal DF can be selected. Further, the frequency of each of the second local signals LO2 generated by the phase controller 64 may be controlled as needed.

As described above, the frequency of the subcarrier signal in each of the transponders 14 is hopped, preferably, in a manner that varies from transponder to transponder. Since the reflected wave $F_{rf}$ whose frequency is hopped is received at its entire band by the interrogator 60, the response signal transmitted from each of all the transponders 14 existing within a communicable range is outputted from one of the communication channels. Thus, with the output signals being time-sequentially rearranged for the respective transponders 14, it is possible to simultaneously detect the response signals from the plurality of transponders 14. To this end, it is preferable that each transponder 14 is arranged to transmit data such as ID identifying the transponder 14, each time the frequency hopping is effected.

In the communication system 10 including the plurality of transponders 14 existing within the communicable range, there is a case where the transponders 14 are moving individually from each other. In the present second embodiment, the interrogator 60 includes the same number of second mixers 28 as the communication channels, wherein the second mixers 28 generate the respective demodulated signals DF related to the communications in the respective communication channels, based on the respective second local signals LO2 which are different from each other with respect to the phase and/or frequency. Since each of the second local signals LO2 supplied to the respective second mixers 28 is suitably controlled by the phase controller 64, the modulation-related signal having a maximized signal-to-noise ratio S/N can be extracted from each of the reflected waves $F_{rf}$, even where there mixedly exist the reflected waves $F_{rf}$ which are transmitted from the respective transponders 14.

Figure 22:
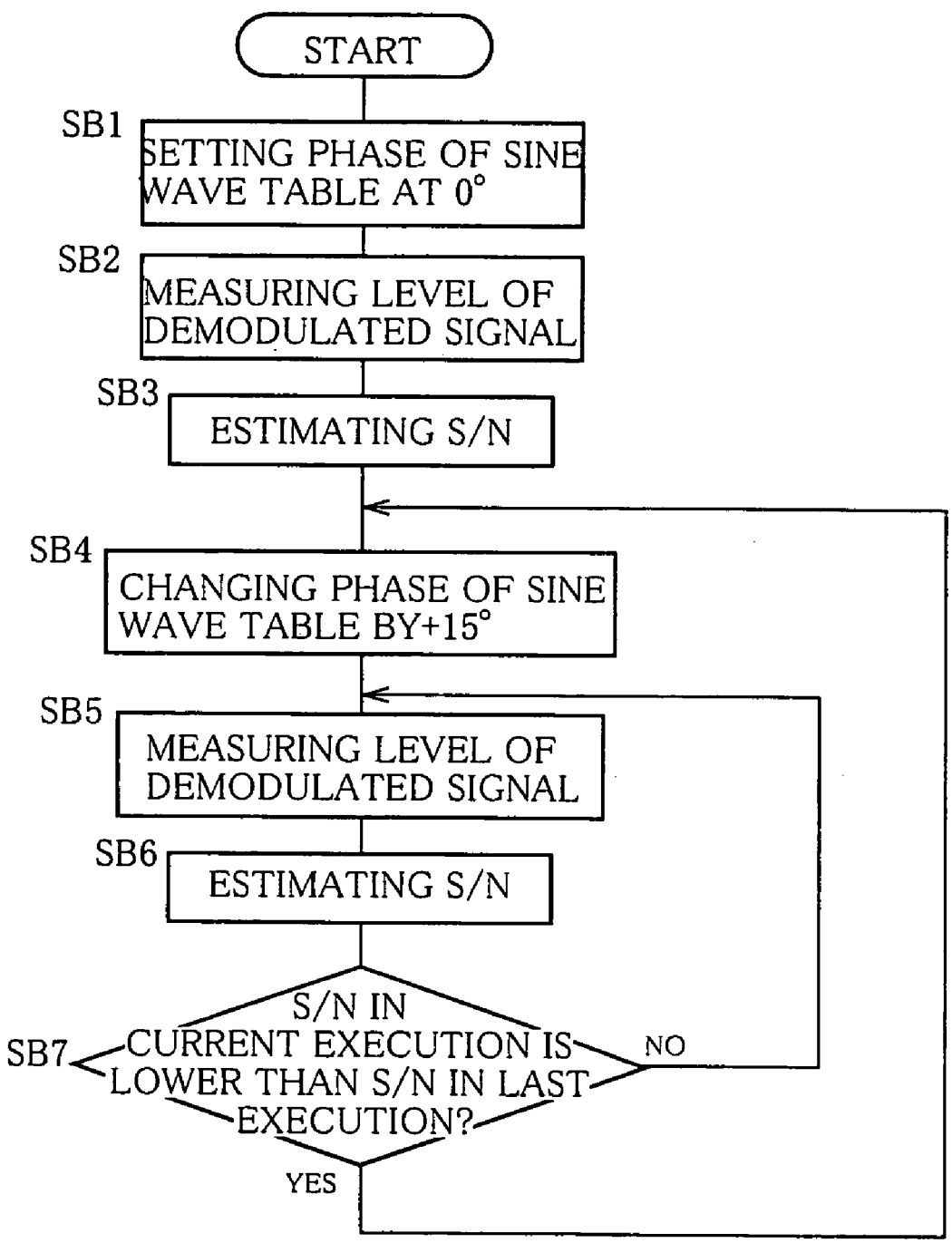
FIG. 22 is a flow chart illustrating a main portion of a phase control routine executed by a controller of FIG. 19, for controlling phase of a second local signal.

FIG. 22 is a flow chart illustrating a main portion of a phase control routine executed by the main controller 32 to cause the phase controller 30 to control the phase of the second local signal LO2, by using the sine wave table 68 of FIG. 21. This routine is executed repeatedly with an extremely short cycle time ranging from several msec to several tens msec.

The routine is initiated with step SB1 in which the phase difference dθ in the sine wave table 68 is set to be 0° as an initial value. Step SB1 is followed by step SB2 that is implemented to measure a signal level of the demodulated signal DF outputted from the second mixer 28. Step SB3 is then implemented to estimate the signal-to-noise ratio S/N of the demodulated signal DF, based on the signal level measured in step SB2. Next, in step SB4 that is implemented by the phase controlling portion 44 of the main controller 32, the phase difference d0 of the sine wave table 68 is changed by +15°. Step SB5 is then implemented to measure the signal level of the demodulated signal DF outputted from the second mixer 28, like step SB2. Next, step SB6 is implemented to estimate the signal-to-noise ratio S/N of the demodulated signal DF, based on the signal level measured in step SB5, like step SB3. Step SB6 is followed by step SB7 that is implemented to determine whether a value of the signal-to-noise ratio S/N estimated in the current execution of the routine is lower than a value of the signal-to-noise ratio S/N estimated in the last execution of the routine. If an affirmative decision is obtained in the determination of step SB7, the control flow goes to step SB4 so that step SB4 and the subsequent steps are implemented again. If a negative decision is obtained in the determination of step SB7, the control flow goes to step SB5 so that step SB5 and the subsequent steps are implemented again. In the phase control routine, steps SB2, SB3, SB5, SB6 and SB7 are implemented by the phase controlling portion 42 of the main controller 32.

As is clear from the above description, in the interrogator 60 constructed according to the second embodiment, the plurality of second mixers 28 serving as the second frequency-converters are provided to generate respective demodulated signals DF, based on the respective second local signals LO2 which are different from each other with respect to at least one of the phase and the frequency thereof. This arrangement makes it possible to generate each of the demodulated signals DF in a manner suitable, for example, for a distances between the interrogator 12 and a corresponding one of the plurality of transponders 14. Particularly, in the communication system 10 in which the subcarrier waves are subjected to the frequency hopping, since the demodulation processings for the respective subcarrier waves can be concurrently effected, it is possible to satisfactorily detect the signal related to the modulation performed by each of the transponders 14, even where there are mixedly exist the plurality of reflected waves $F_{rf}$ which are transmitted from the respective transponders 14.

Further, in the interrogator 60 of the second embodiment, the same number of second mixers 28 as the communication channels are provided to generate the respective demodulated signals DF related to communications performed in the respective communication channels, based on the respective second local signals LO2 which are different from each other with respect to at least one of the phase and frequency thereof. In this arrangement, since there are provided the same number of second mixers 28 as the number of communication channels, i.e., as the maximum number of establishable communication lines, it is possible to most effectively utilize a communication area.

Further, since the phase controller 64 controls the phase and frequency of the second local signal LO2, based on one cycle of the periodic function that is previously determined, it is possible to reduce load imposed on the phase controller 64, by calculating the second local signal LO2 with use of the predetermined periodic function.

Further, the phase controller 64 serving also as the second local oscillator is arranged to generate one of the plurality of second local signals LO2 which are previously determined and which are different from each other with respect to at least one of the phase and the frequency thereof. This arrangement enables the load imposed on the phase controller 64, to be reduced as much as possible, by using the one of the predetermined second local signals LO2.

Further, the phase controller 64 is arranged to control the phase and frequency of the second local signal LO2, based on one cycle of a periodic function that is previously calculated. This arrangement permits reduction in the load imposed on the phase controller 64, by repeatedly using the previously calculated periodic function, and also permits reduction in amount of data that is to be previously stored in, for example, the data storage.

Further, the phase controller 64 is arranged to generate one of the plurality of second local signals LO2 which are previously calculated and which are different from each other with respect to at least one of the phase and the frequency thereof. This arrangement permits remarkable reduction in the load imposed on the phase controller 64, by repeatedly using the previously calculated second local signals LO2, and also permits reduction in amount of data that is to be previously stored in, for example, the data storage.

Where the number of the transponders 14 each available for the communication is smaller than that of the communication channels, the number of the second mixers 28 may be increased or reduced depending upon the number of the transponders 14. The number of parallel processing can be easily changed owing to use of the digital processing, and the provision of the required number of the second mixer 28 leads to increase in the efficiency of the demodulation processing. It is preferable to prepare the same number of the second mixers 28 as the number of the phases defined in the periodic function table such as the sine wave function 68, and to select, from among the outputs of the respective second mixers 28, one or ones that are higher than a threshold value of the signal-to-noise ratio S/N, for thereby maximizing the efficiency of the demodulation processing.

Third Embodiment

Referring next to FIGS. 23-26, there will be described an interrogator 70 that is constructed according to a third embodiment of the invention.

Figure 23:
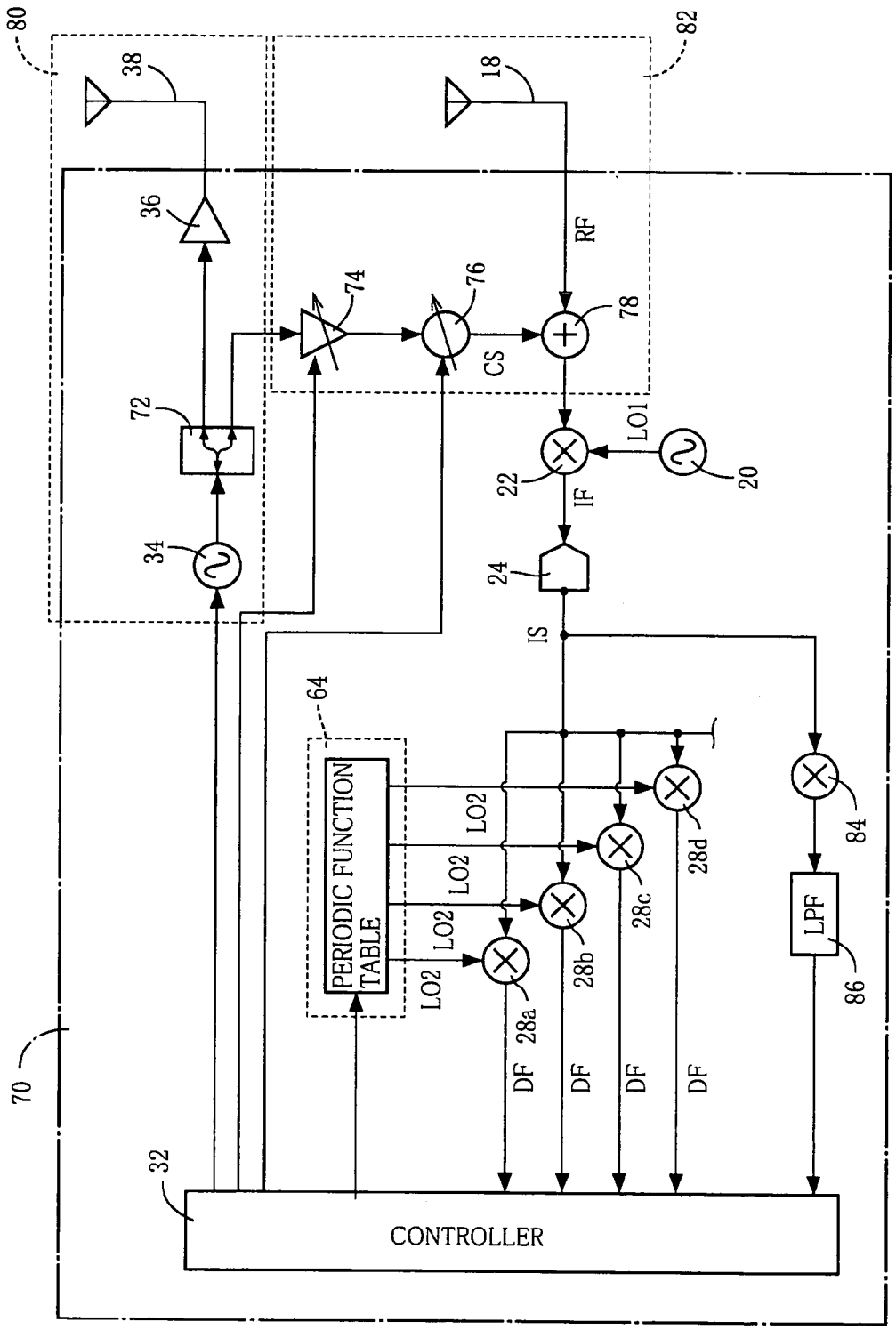
FIG. 23 is a view showing an arrangement of an interrogator, which is constructed according to a third embodiment of the invention.

As shown in FIG. 23, the interrogator 70 includes: a distributor or divider 72 operable to divide the main carrier wave $F_{c1}$ generated by the main carrier oscillator 34, into a transmission signal and a cancel signal CS; a cancel-signal amplitude adjuster 74 operable to adjust amplitude of the cancel signal CS supplied from the divider 72; a cancel-signal phase adjuster 76 operable to adjust phase of the cancel signal CS; and a multiplexer 78 serving as a combiner operable to combine the cancel signal CS (whose amplitude and phase have been adjusted by the respective adjusters 74, 76) and the reflected wave $F_{rf}$ (received as the received signal RF by the receiving antenna 18). The multiplexer 78, after combining the cancel signal CS and the reflected wave $F_{rf}$, outputs a composite signal, i.e., combination of the cancel signal CS and the reflected wave $F_{rf}$, and the composite signal is inputted to the first mixer 22 as the first frequency-converter. The intermediate signal IS outputted from the A/D converter 24 is supplied to the main controller 32 via a third mixer 84 and a low pass filter 86. In the present interrogator 70, the main carrier oscillator 34, divider 72, amplifier 36 and transmitting antenna 38 cooperate to constitute a transmitting portion 80, while the receiving antenna 18, cancel-signal amplitude adjuster 74, cancel-signal phase adjuster 76 and multiplexer 78 cooperate to constitute a receiving portion 82.

Figure 24:
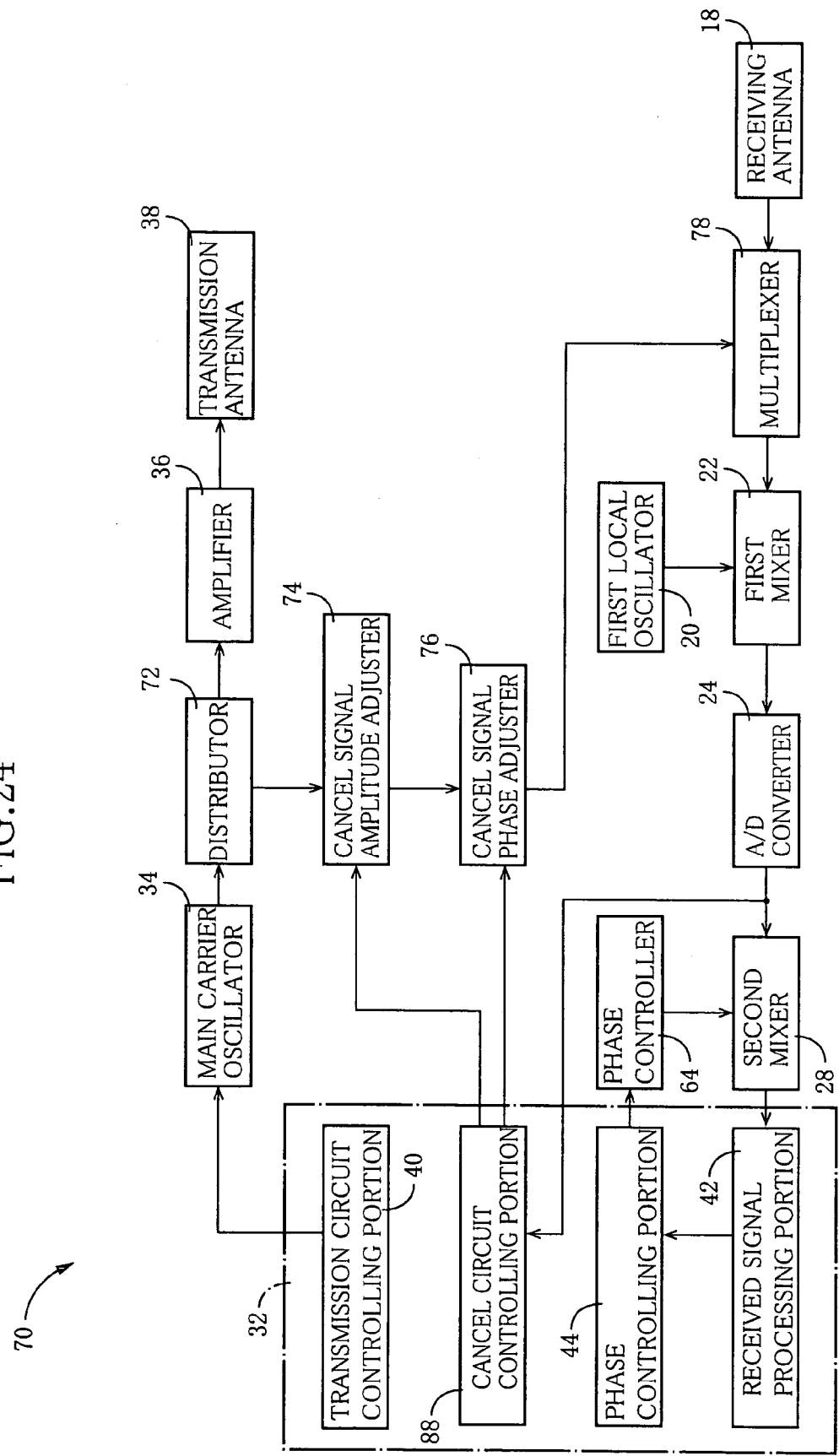
FIG. 24 is a block diagram showing an arrangement of a controller that is provided in the interrogator of FIG. 23.

FIG. 24 is a block diagram showing an arrangement of the main controller 32 that is provided in the interrogator 70. The controller 32 includes, in addition to the transmission circuit controlling portion 40, received signal processing portion 42 and phase controlling portion 44, a cancel circuit controlling portion 88 assigned to adjust the amplitude and phase of the cancel signal CS through the cancel-signal amplitude adjuster 74 and cancel-signal phase adjuster 76, such that the output of the multiplexer 78 is reduced. That is, by controlling the amplitude and phase of the cancel signal CS such that the main carrier component of the reflected wave $F_{rf}$ received as the received signal RF by the receiving antenna 18 is offset or canceled by the cancel signal CS, the main carrier component of the reflected wave $F_{rf}$ is minimized before the frequency conversion performed by the first mixer 22 as the first frequency-converter. Preferably, the amplitude and phase of the cancel signal CS are adjusted in a manner that minimizes the intermediate signal IS or its main carrier component supplied to the main controller 32 via the third mixer 84 and low pass filter 86.

Figure 25:
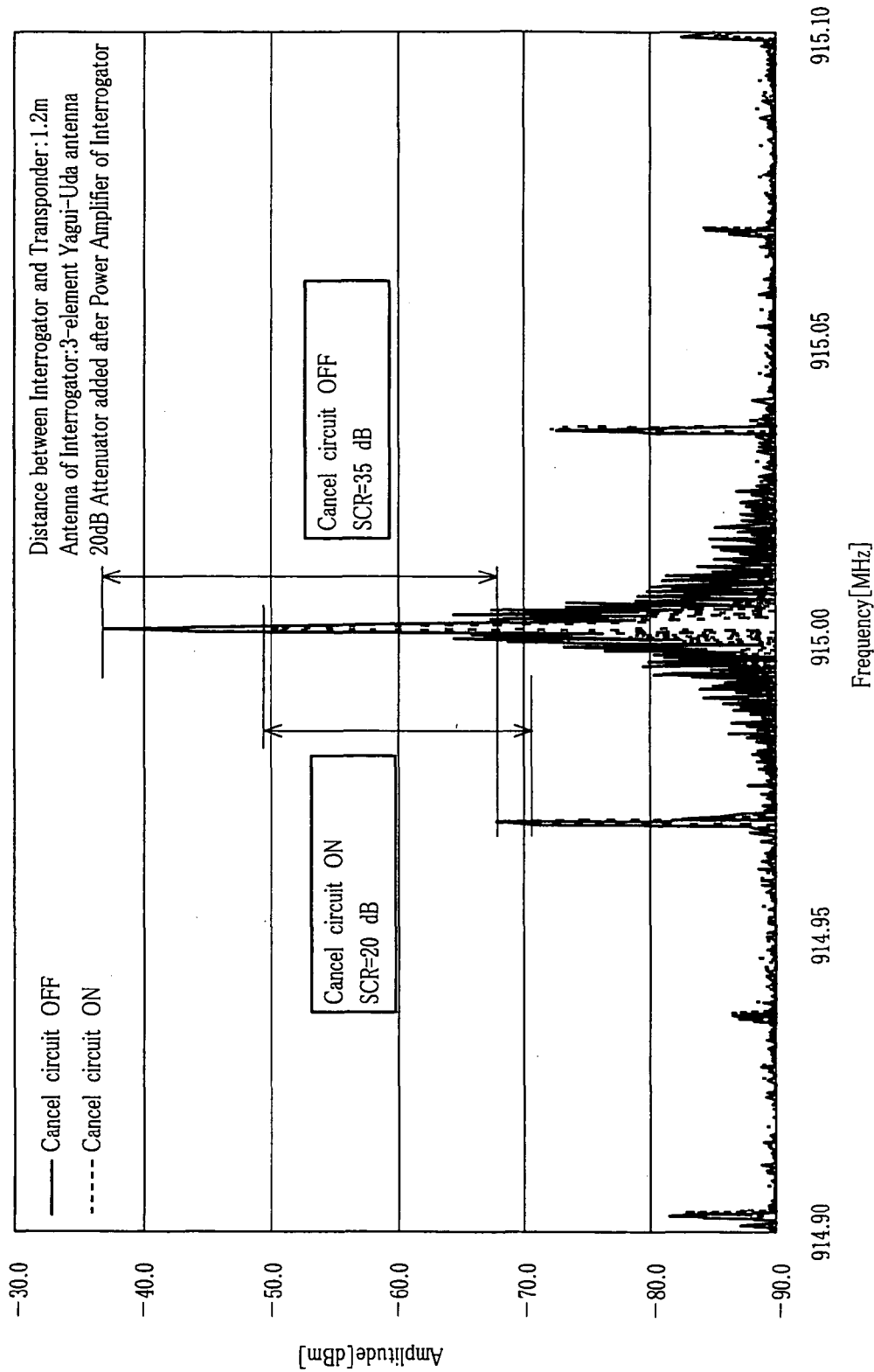
FIG. 25 is a graph for showing a received signal that is inputted to a first frequency-converter after being multiplied with a cancel signal by a multiplexer of FIG. 23, as compared with a received signal that is inputted to the first frequency-converter directly from a receiving antenna.

FIG. 25 is a graph for showing a received signal that is inputted to the first mixer 22 after being multiplied with the cancel signal CS by the multiplexer 78 (cancel circuit ON), as compared with a received signal that is inputted to the first mixer 22 directly from the receiving antenna 18 (cancel circuit OFF). As is apparent from FIG. 25, in the present third embodiment, SCR (signal carrier ratio, i.e., difference between the main carrier component and subcarrier component) of the signal inputted to the first mixer 22 can be made smaller by about 15 dB, than an arrangement without the cancel circuit. That is, by thus suppressing the main carrier component, it is possible to increase a relative ratio of the subcarrier component related to the modulation performed by the transponder 14, thereby facilitating extraction of the signal related to the modulation performed by the transponder 14, which signal is much smaller than the main carrier wave $F_{c1}$.

Figure 26:
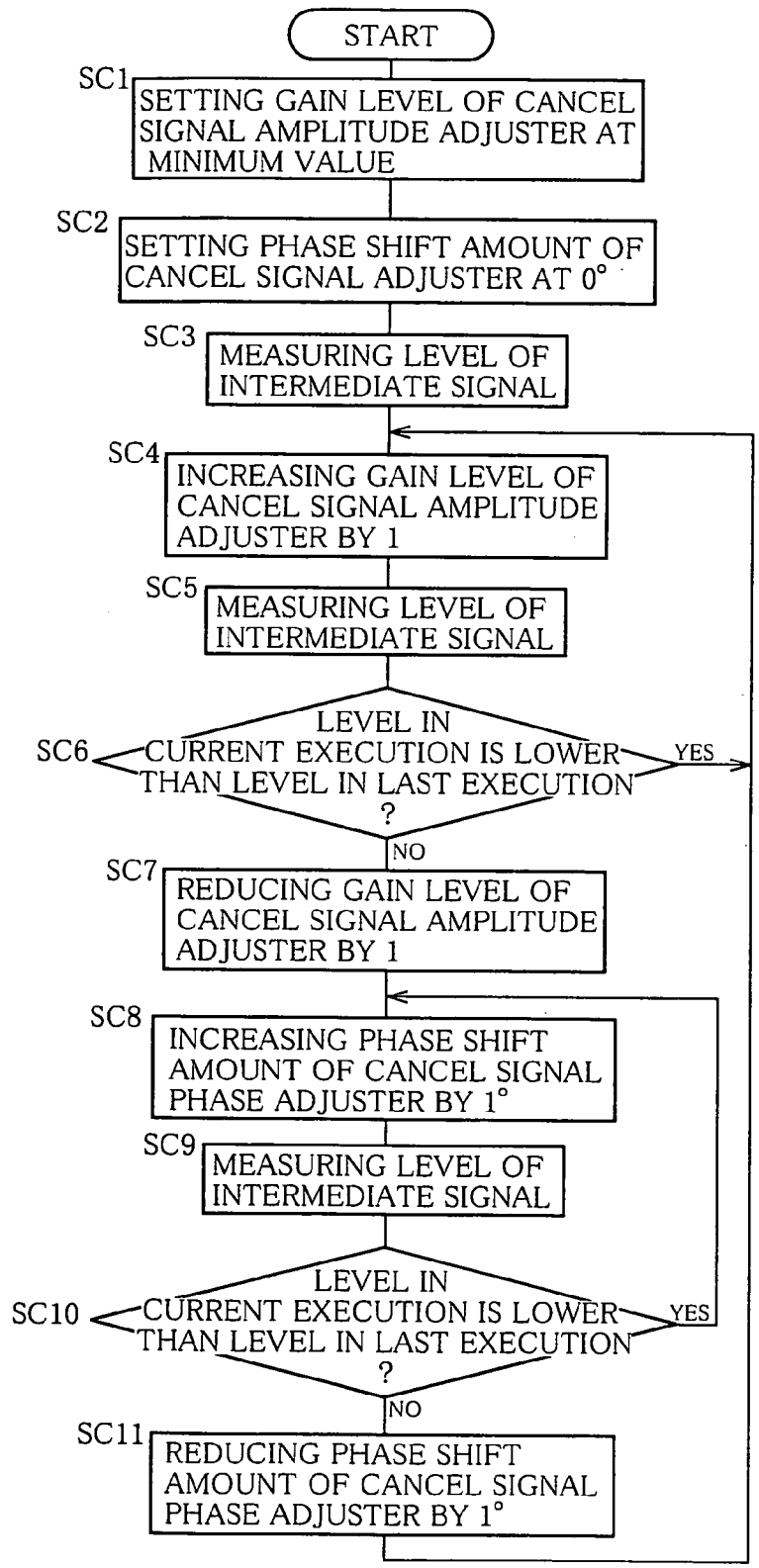
FIG. 26 is a flow chart illustrating a main portion of a cancel signal control routine executed by a controller of FIG. 23.

FIG. 26 is a flow chart illustrating a main portion of a cancel signal control routine executed by the cancel circuit controlling portion 88 of the main controller 32. This routine is executed repeatedly with an extremely short cycle time ranging from several msec to several tens msec.

The routine is initiated with step SC1 in which a gain level of the cancel-signal amplitude adjuster 74 is set at a minimum value. Step SC1 is followed by step SC2 in which a phase shift amount of the cancel-signal phase adjuster 76 is set at 0°. Subsequently, step SC3 is implemented to measure a signal level of the intermediate signal IS supplied to the controller 32 form the A/D converter 24 via the third mixer 84 and low pass filter 86. Step SC3 is followed by step SC4 in which the gain level of the cancel-signal amplitude adjuster 74 is increased by "+1", and then step SC5 is implemented to measure the signal level of the intermediate signal IS again. Step SC6 is implemented to determine whether the signal level measured in the current execution of the routine is lower than the signal level measured in the last execution of the routine. If an affirmative decision is obtained in the determination of step SC6, the control flow goes to step SC4 so that step SC4 and the subsequent steps are implemented again. If a negative decision is obtained in the determination of step SC6, the control flow goes to step SC7 in which the gain level of the cancel-signal amplitude adjuster 74 is increased by "−1", and step SC8 in which the phase shift amount of the cancel-signal phase adjuster 76 is increased by 1°. Then, step SC9 is implemented to measure the signal level of the intermediate signal IS again. In the subsequent step SC10, it is determined whether the signal level measured in the current execution of the routine is lower than the signal level measured in the last execution of the routine. If an affirmative decision is obtained in the determination of step SC10, the control flow goes to step SC8 so that step SC8 and the subsequent steps are implemented again. If a negative decision is obtained in the determination of step SC10, the control flow goes to step SC11 in which the phase shift amount of the cancel-signal phase adjuster 76 is reduced by 1°. After the implementation of step S01, the step SC4 and the subsequent steps are implemented again. In this cancel signal control routine, steps SC1-SC11 are implemented by the cancel circuit controlling portion 88 of the main controller 32.

As described above, in the interrogator 70 of the third embodiment, the transmitting portion 80 includes: the main carrier oscillator 34 operable to generate the main carrier wave $F_{c1}$; the divider 72 operable to divide the main carrier wave $F_{c1}$; into the transmission signal and the cancel signal CS; the amplifier 36 serving as the transmission signal amplifier operable to amplify the transmission signal supplied from the divider 72; and the transmitting antenna 38 operable to transmit the transmission signal, while the receiving portion 82 includes: the receiving antenna 18 operable to receive the reflected wave $F_{rf}$ as the received signal RF; the cancel-signal amplitude adjuster 74 operable to adjust the amplitude of the cancel signal CS supplied from the divider 72; the cancel-signal phase adjuster 76 operable to adjust the phase of the cancel signal CS; and the multiplexer 78 serving as the combiner operable to combine the cancel signal CS (whose amplitude and phase have been adjusted by the respective adjusters 74, 76) and the reflected wave $F_{rf}$ (received as the received signal RF by the receiving antenna 18), and to output the output in the form of a composite signal, i.e., combination of the reflected wave $F_{rf}$ and the cancel signal CS. The cancel-signal amplitude adjuster 74 and the cancel-signal phase adjuster 76 adjust the amplitude and phase of the cancel signal CS, respectively, such that the output of the multiplexer 78 is reduced. This arrangement, by suppressing the main carrier component of the reflected wave $F_{rf}$ before the frequency conversion performed by the first mixer 22 serving as the first frequency-converter, makes it possible to extract the modulation-related signal having a maximized signal-to-noise ratio S/N.

Fourth Embodiment

Figure 27:
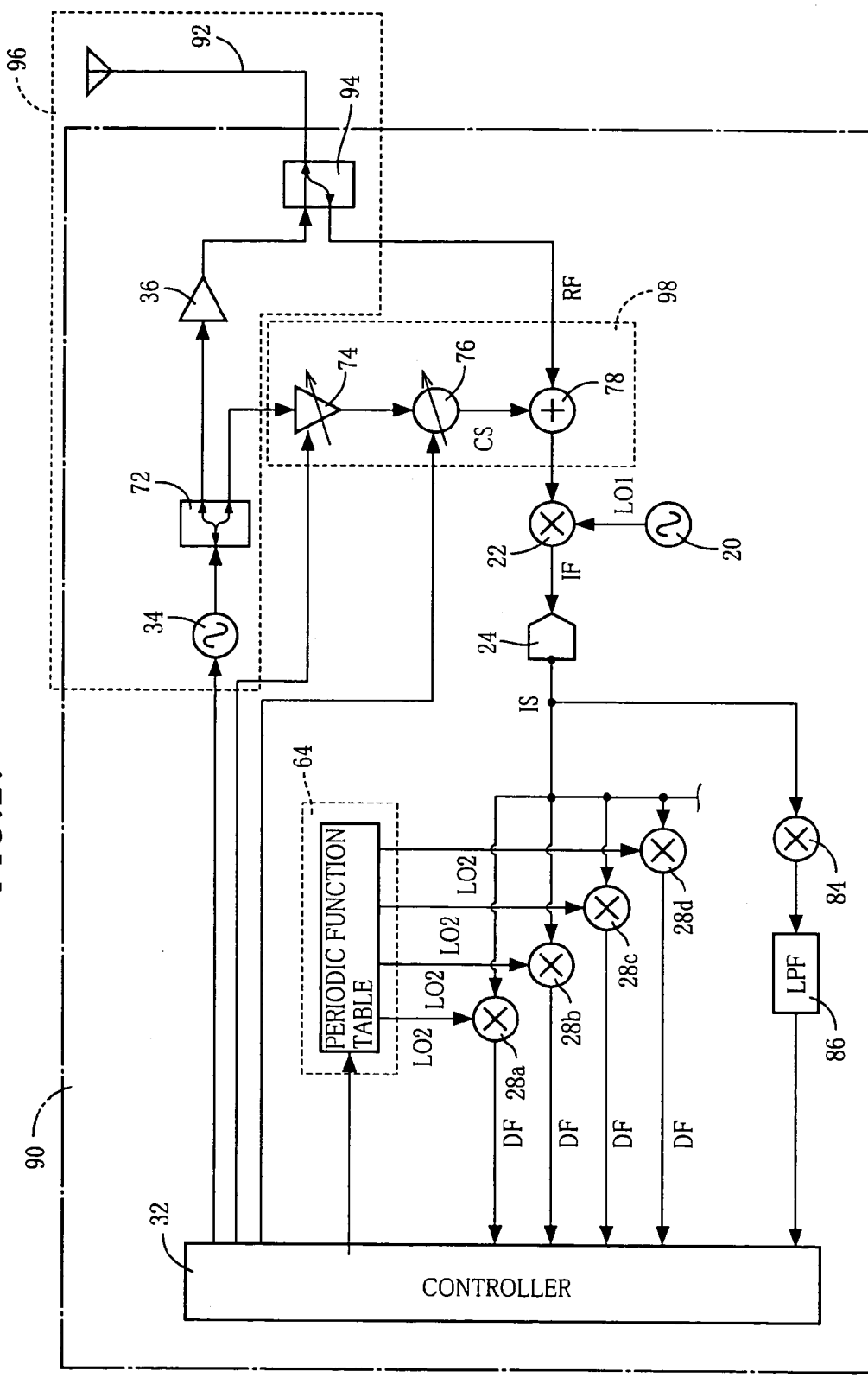
FIG. 27 is a view showing an arrangement of an interrogator, which is constructed according to a fourth embodiment of the invention.

Referring next to FIG. 27, there will be described an interrogator 90 that is constructed according to a fourth embodiment of the invention.

As shown in FIG. 27, the interrogator 90 includes a transmitting and receiving antenna 92 and a separator 94, in place of the receiving antenna 18 and the transmitting antenna 38 used in each of the above-described first through third embodiments. The transmitting and receiving antenna 92 is arranged to transmit the main carrier wave $F_{c1}$ and also to receive the reflected wave $F_{rf}$ as the received signal RF. The separator 94 is arranged to supply the transmission signal amplified by the amplifier 36, to the transmitting and receiving antenna 92, while supplying the reflected wave $F_{rf}$ received by the transmitting and receiving antenna 92, to the multiplexer 78. In this interrogator 90, the main carrier oscillator 34, divider 72, amplifier 36 and transmitting and receiving antenna 92 cooperate to constitute a transmitting portion 96, while the cancel-signal amplitude adjuster 74, cancel-signal phase adjuster 76, multiplexer 78 and transmitting and receiving antenna 92 cooperate to constitute a receiving portion 98.

As described above, in the interrogator 90 of the fourth embodiment, the transmitting and receiving antenna 92 is provided to transmit the main carrier wave $F_{c1}$ and receive the reflected wave $F_{rf}$ as the received signal RF, The transmitting portion 96 includes: the main carrier oscillator 34 operable to generate the main carrier wave $F_{c1}$; the divider 72 operable to divide the main carrier wave $F_{c1}$ into the transmission signal and the cancel signal CS; the transmission signal amplifier 36 operable to amplify the transmission signal supplied from the divider 72; and the separator 94 operable to supply the transmission signal (amplified by the amplifier 36) to the transmitting and receiving antenna 92 and to supply the reflected wave $F_{rf}$ (received by the antenna 92) to the receiving portion 98. Meanwhile, the receiving portion 98 includes: the cancel-signal amplitude adjuster 74 operable to adjust the amplitude of the cancel signal CS; the cancel-signal phase adjuster 76 operable to adjust the phase of the cancel signal CS; and the multiplexer 78 serving as the combiner operable to combine the cancel signal CS (whose amplitude and phase have been adjusted by the respective adjusters 74, 76) and the reflected wave $F_{rf}$ (received as the received signal RF by the receiving antenna 18), and to output the output in the form of a composite signal, i.e., combination of the reflected wave $F_{rf}$ and the cancel signal CS. The cancel-signal amplitude adjuster 74 and the cancel-signal phase adjuster 76 adjust the amplitude and phase of the cancel signal CS, respectively, such that the output of the multiplexer 78 is reduced. In this arrangement, since the transmission of the main carrier wave $F_{c1}$ and the reception of the reflected wave $F_{rf}$ are both performed by the transmitting and receiving antenna 92, the interrogator 90 can be made compact in size.

Fifth Embodiment

Figure 28:
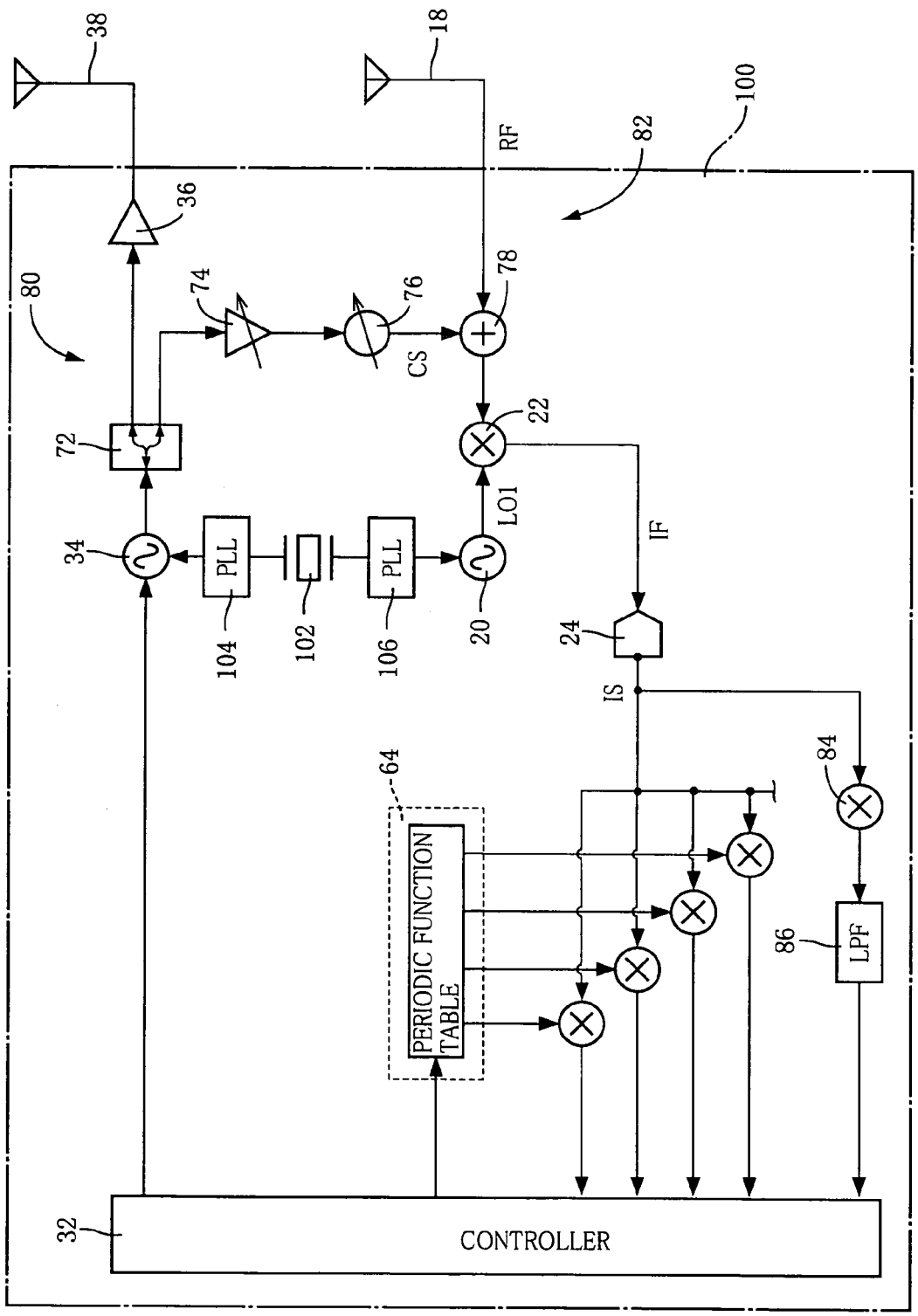
FIG. 28 is a view showing an arrangement of an interrogator, which is constructed according to a fifth embodiment of the invention.

Referring next to FIG. 28, there will be described an interrogator 100 that is constructed according to a fifth embodiment of the invention.

As shown in FIG. 28, in the interrogator 100, a reference frequency generator 102 is provided to generate a reference frequency. The reference frequency generated by the reference frequency generator 102 is supplied to the main carrier oscillator 34 via a PLL (phase locked loop) 104 and also to the first local oscillator 20 via another PLL (phase locked loop) 106, so that the main carrier oscillator 34 and the first local oscillator 20 generate the main carrier wave $F_{c1}$ and the first local signal L01, respectively, based on the reference frequency generated by the reference frequency generator 102. In general, a frequency generated by a certain frequency generator is fluctuated by various factors such as temperature. However, in the present fifth embodiment, since the reference frequency is used as a common frequency for both of the generation of the main carrier wave $F_{c1}$ and the generation of the first local signal LO1, it is possible to reduce possibility of fluctuation of the frequency and to restrain generation of unnecessary signal having a low frequency.

Sixth Embodiment

Figure 29:
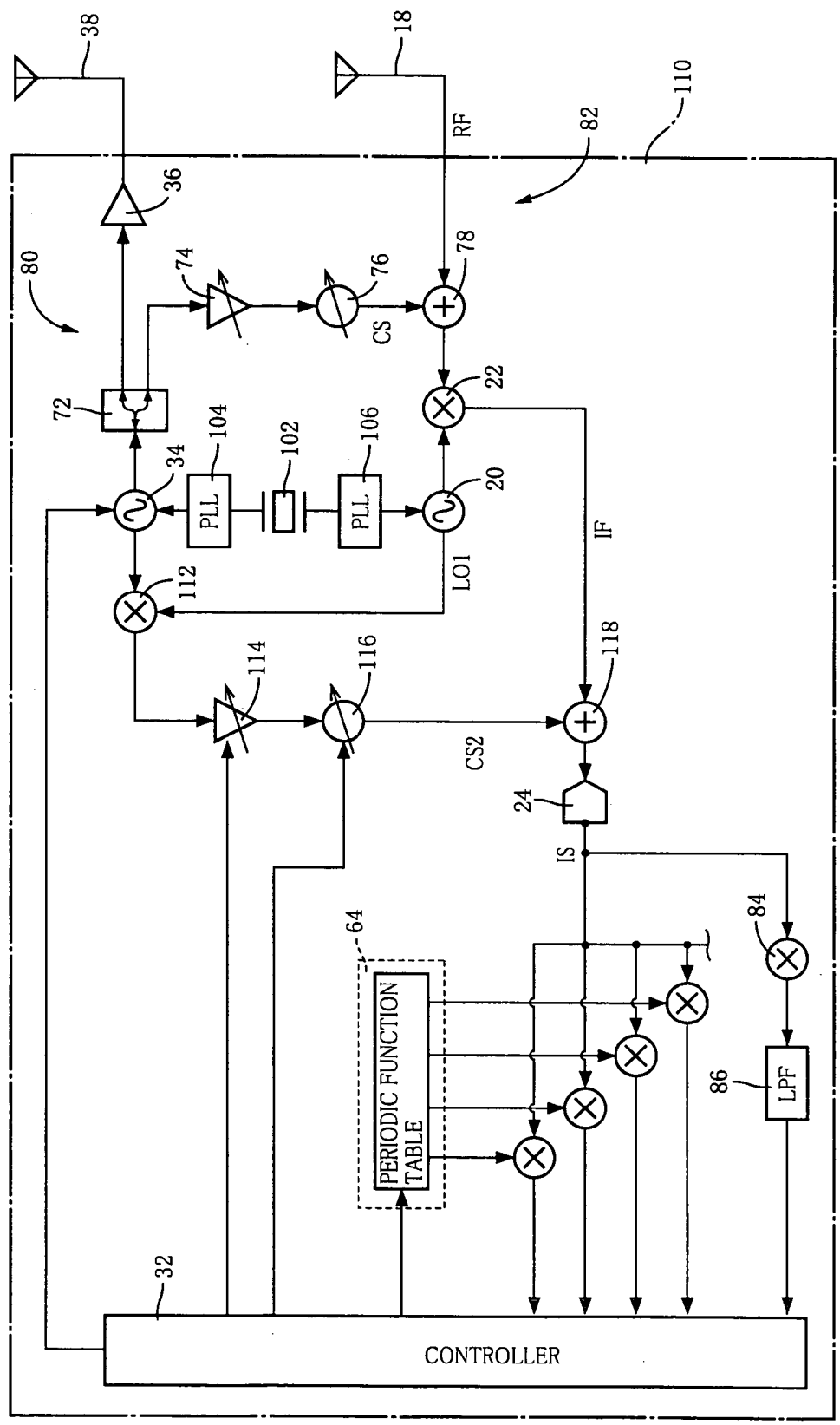
FIG. 29 is a view showing an arrangement of an interrogator, which is constructed according to a sixth embodiment of the invention.
Figure 30:
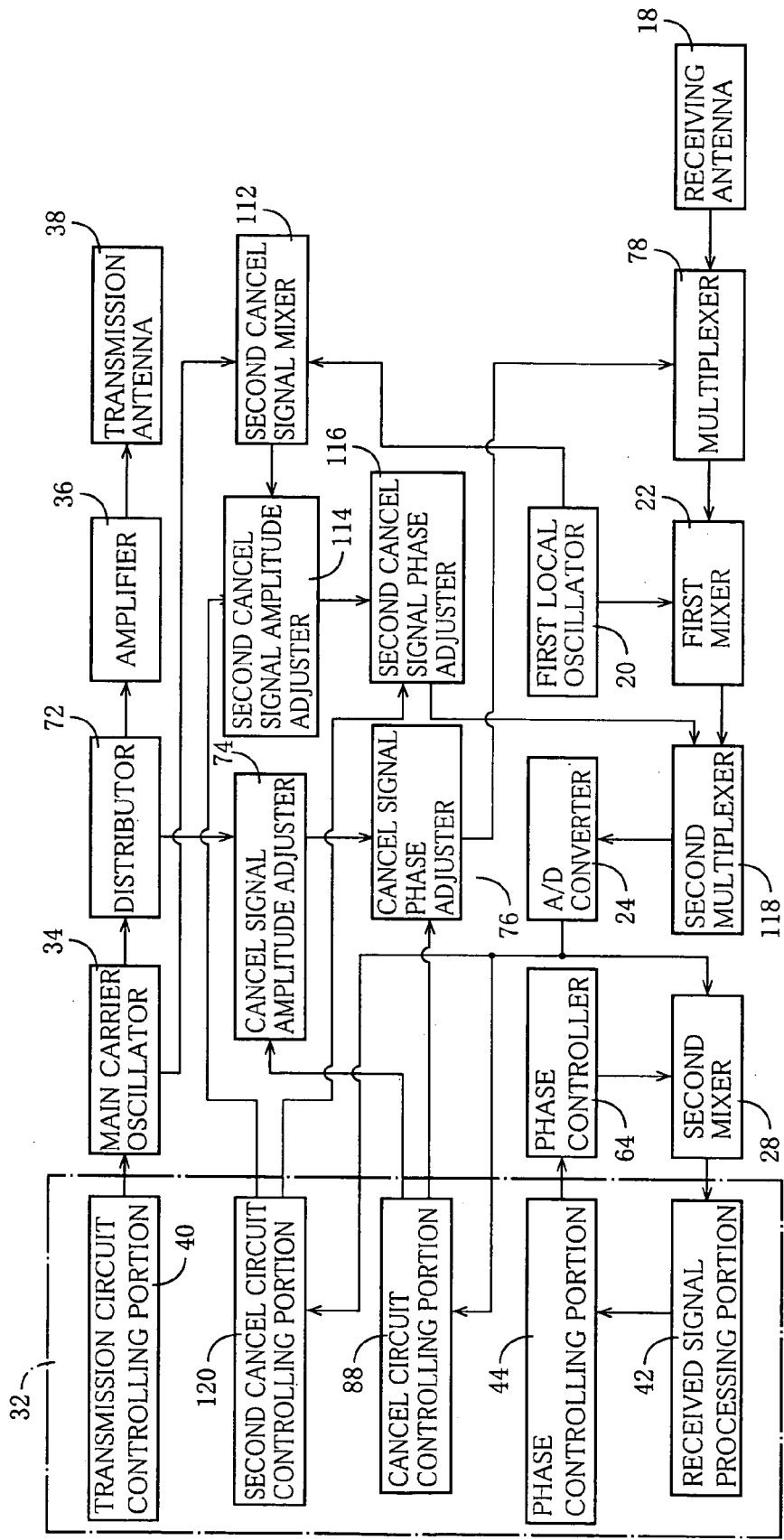
FIG. 30 is a block diagram showing an arrangement of a controller that is provided in the interrogator of FIG. 29.
Figure 31:
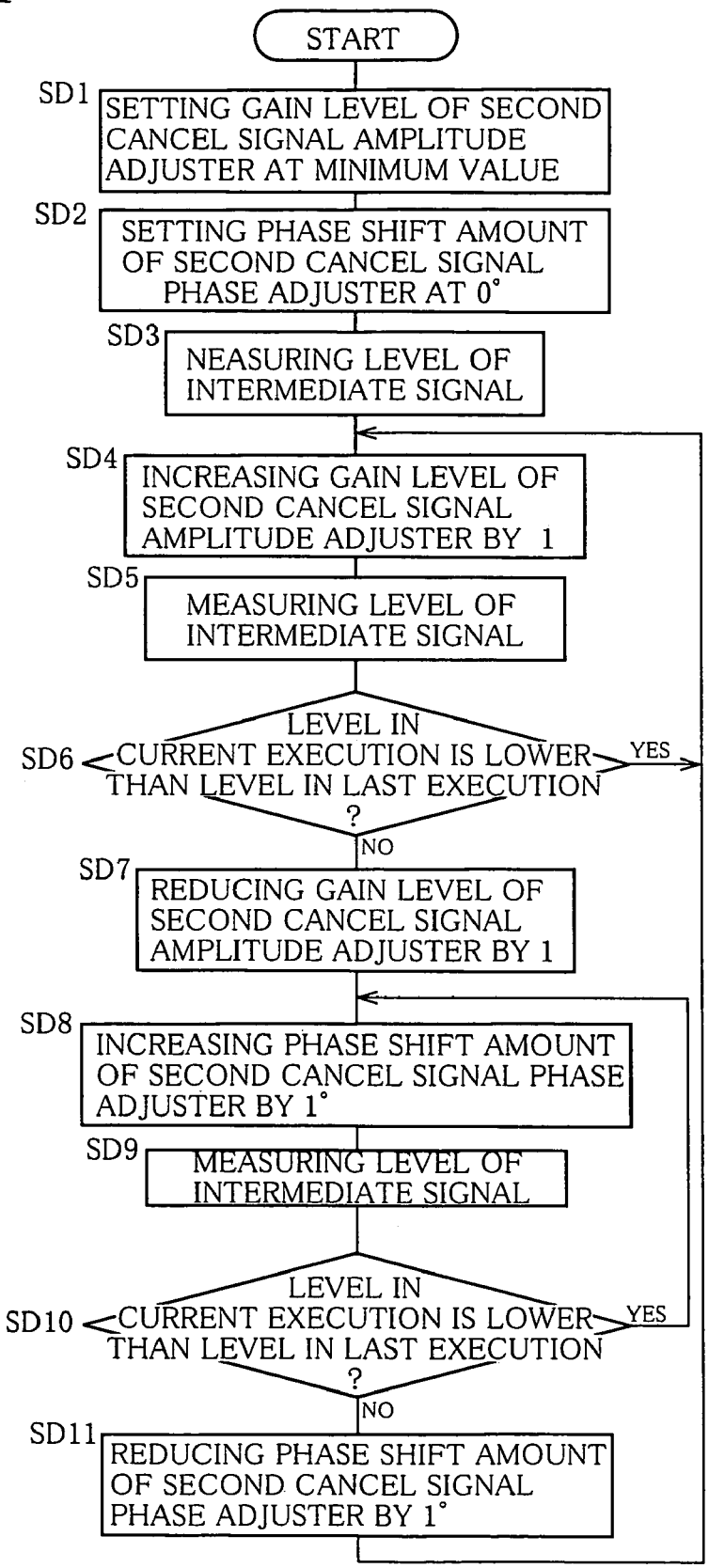
FIG. 31 is a flow chart illustrating a main portion of a second cancel signal control routine executed by a controller of FIG. 30.

Referring next to FIGS. 29-31, there will be described an interrogator 110 that is constructed according to a sixth embodiment of the invention.

As shown in FIG. 29, the interrogator 110 includes: a second cancel signal mixer 112 operable to generate a second cancel signal CS2, by multiplying the main carrier wave $F_{C1}$ (generated by the main carrier oscillator 34) with the first local signal LO1 (generated by the first local oscillator 20); a second cancel-signal amplitude adjuster 114 operable to adjust amplitude of the second cancel signal CS2 generated by the second cancel signal mixer 112; a cancel-signal phase adjuster 116 operable to adjust phase of the second cancel signal CS2; and a second multiplexer 118 serving as a second combiner operable to combine the second cancel signal CS2 (whose amplitude and phase have been adjusted by the respective adjusters 114, 116) and the intermediate frequency signal IF (generated by the first mixer 22 as the first frequency-converter), and to output an output in the form of a composite signal, i.e., of combination of the second cancel signal CS2 and the intermediate frequency signal IF. The composite signal, i.e., the output of the second multiplexer 118 is converted by the A/D converter 24, into a digital signal, and is then inputted to the second frequency-converters.

FIG. 30 is a block diagram showing an arrangement of the main controller 32 that is provided in the interrogator 110. The controller 32 includes, in addition to the transmission circuit controlling portion 40, received signal processing portion 42, phase controlling portion 44 and cancel circuit controlling portion 88, a second cancel circuit controlling portion 120 assigned to adjust the amplitude and phase of the second cancel signal CS2 through the second cancel-signal amplitude adjuster 114 and second cancel-signal phase adjuster 116, such that the output of the second multiplexer 118 is reduced. That is, by controlling the amplitude and phase of the second cancel signal CS2 such that the main carrier component of the intermediate frequency signal IF generated by the first mixer 22 is offset or canceled by the second cancel signal CS2, the main carrier component of the intermediate frequency signal IF is minimized before the frequency conversion performed by the second frequency-converters. Preferably, the amplitude and phase of the second cancel signal CS2 are adjusted in a manner that minimizes the intermediate signal IS or its main carrier component supplied to the main controller 32 via the third mixer 84 and low pass filter 86.

FIG. 31 is a flow chart illustrating a main portion of a second cancel-signal control routine executed by the second cancel circuit controlling portion 120 of the main controller 32. This routine is executed repeatedly with an extremely short cycle time ranging from several msec to several tens msec.

The routine is initiated with step SD1 in which a gain level of the second cancel-signal amplitude adjuster 114 is set at a minimum value. Step SD1 is followed by step SD2 in which a phase shift amount of the second cancel-signal phase adjuster 116 is set at 0°. Subsequently, step SD3 is implemented to measure a signal level of the intermediate signal IS supplied to the controller 32 form the A/D converter 24 via the third mixer 84 and low pass filter 86. Step SD3 is followed by step SD4 in which the gain level of the second cancel-signal amplitude adjuster 114 is increased by "+1", and then step SD5 is implemented to measure the signal level of the intermediate signal IS again. Step SD6 is implemented to determine whether the signal level measured in the current execution of the routine is lower than the signal level measured in the last execution of the routine. If an affirmative decision is obtained in the determination of step SD6, the control flow goes to step SD4 so that step SD4 and the subsequent steps are implemented again. If a negative decision is obtained in the determination of step SD6, the control flow goes to step SD7 in which the gain level of the second cancel-signal amplitude adjuster 114 is increased by "A", and step SD8 in which the phase shift amount of the second cancel-signal phase adjuster 116 is increased by 1°. Then, step SD9 is implemented to measure the signal level of the intermediate signal IS again. In the subsequent step SD10, it is determined whether the signal level measured in the current execution of the routine is lower than the signal level measured in the last execution of the routine. If an affirmative decision is obtained in the determination of step SD10, the control flow goes to step SD8 so that step SD8 and the subsequent steps are implemented again. If a negative decision is obtained in the determination of step SD10, the control flow goes to step SD11 in which the phase shift amount of the second cancel-signal phase adjuster 116 is reduced by 1°. After the implementation of step SD 11, the step SD4 and the subsequent steps are implemented again. In this second cancel-signal control routine, steps SD1-SD11 are implemented by the second cancel circuit controlling portion 120 of the main controller 32.

As described above, the interrogator 110 of the sixth embodiment includes the main carrier oscillator 34 operable to generate the main carrier wave $F_{c1}$; the second cancel signal mixer 112 operable to generate the second cancel signal CS2, by multiplying the main carrier wave $F_{c1}$ (generated by the main carrier oscillator 34) with the first local signal LO1 (generated by the first local oscillator 20); the second cancel-signal amplitude adjuster 114 operable to adjust the amplitude of the second cancel signal CS2 (generated by the second cancel signal mixer 112); the second cancel-signal phase adjuster 116 operable to adjust the phase of the second cancel signal CS2; and the second multiplexer 118 serving as the second combiner operable to combine the second cancel signal CS2 (whose amplitude and phase have been adjusted by the respective adjusters 114, 116) and the intermediate frequency signal IF (generated by the first mixer 22), and to output an output in the form of a composite signal, i.e., combination of the second cancel signal CS2 and the intermediate frequency signal IF. The second cancel-signal amplitude adjuster 114 and the second cancel-signal phase adjuster 116 adjust the amplitude and phase of the second cancel signal CS2, respectively, such that the output of the second multiplexer 118 is reduced. This arrangement, by suppressing the main carrier component of the intermediate frequency signal IF or the intermediate signal IS (as the converted signal converted from the intermediate frequency signal IF) before the frequency conversion performed by the second frequency-converter, makes it possible to extract the modulation-related signal having a maximized signal-to-noise ratio.

Seventh Embodiment

Figure 32:
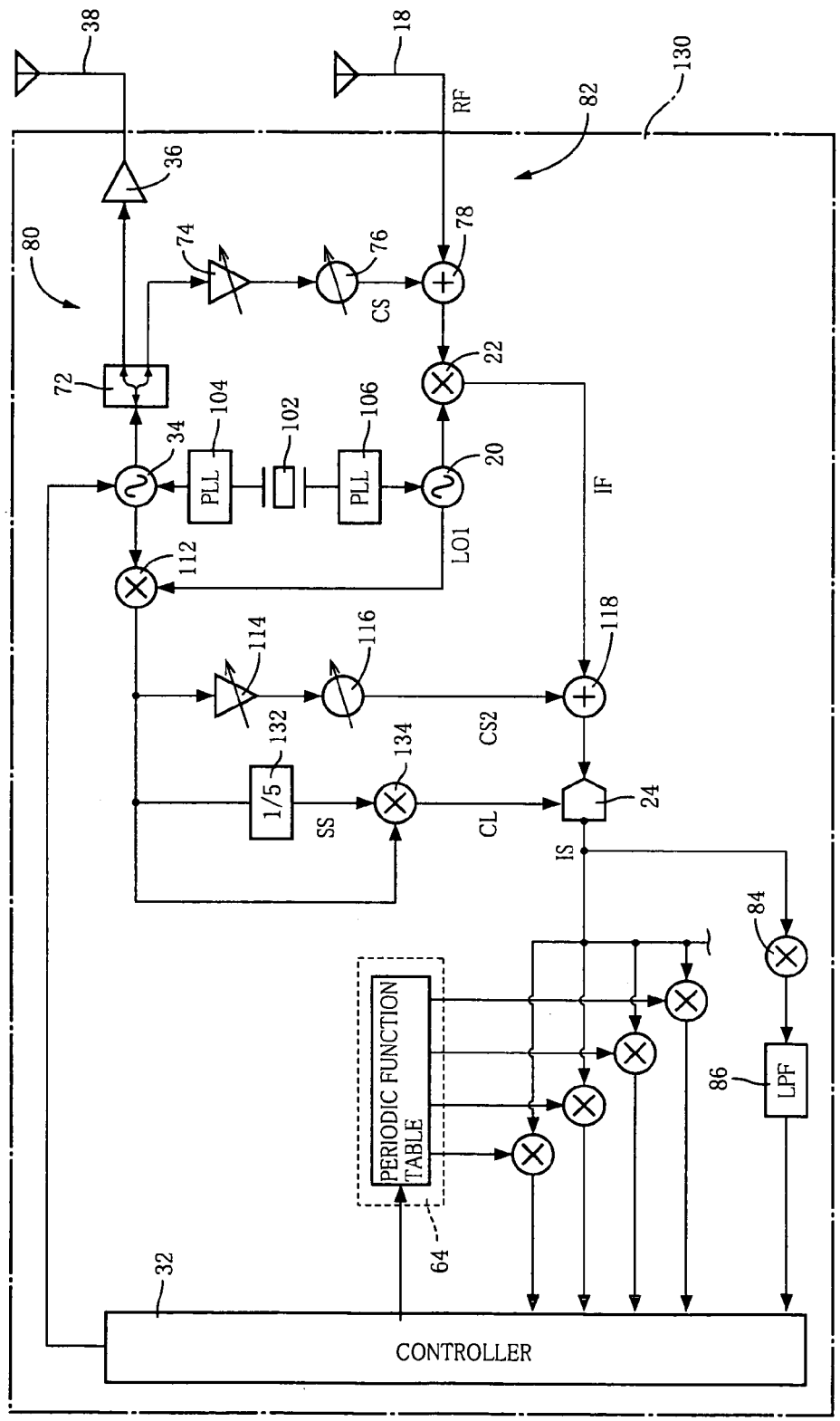
FIG. 32 is a view showing an arrangement of an interrogator, which is constructed according to a seventh embodiment of the invention.

Referring next to FIG. 32, there will be described an interrogator 130 that is constructed according to a seventh embodiment of the invention.

As shown in FIG. 32, the interrogator 130 includes: a frequency divider 132 operable to generate a frequency-divided signal SS, by frequency-dividing the second cancel signal CS2 (generated by the second cancel signal mixer 112) with a frequency division ratio of 0.2 (⅕); and a clock signal mixer 134 operable to generate a clock signal CL, by multiplying the frequency-divided signal SS (generated by the frequency divider 132) with the second cancel signal CS2 (generated by the second cancel signal mixer 112), such that the clock signal CL (generated by the clock signal mixer 134) serves as a clock of the A/D converter 24. In this arrangement in which a sampling signal of the A/D converter is generated based on the main carrier wave $F_{C1}$, it is possible to reduce possibility of error caused by difference between the main carrier wave $F_{C1}$ and sampling cycle.

While the preferred embodiments of the present invention have been described above in detail by reference to the accompanying drawings, for illustrative purpose only, it is to be understood that the present invention may be embodied otherwise than as herein specifically illustrated or described.

In the above-described embodiments, the A/D converter 24 is disposed between the first and second frequency-converters, and the frequency conversion is performed by the digital processing in the second frequency-converter. However, the A/D converter 24 is not essential. The frequency conversion may be performed by an analog processing in the second frequency-converter. Further, the A/D converter 24 may be disposed between the receiving antenna 18 and the first frequency-converter, so that the frequency conversion can be performed by a digital processing in the first frequency-converter.

In the above-described embodiments, each of the first local oscillator 20, first mixer 22, second local oscillator 26, second mixer 28, phase controller 30, main carrier oscillator 34 and amplifier 36 is provided by an apparatus or device that is controlled by the main controller 32. However, some or all of these hard components of the interrogator may be replaced with functional portions incorporated in the main controller 32.

In the above-described embodiments, the main carrier wave $F_{c1}$ is not modulated in the transmitting portion 16 of the interrogator. However, before being transmitted from the transmitting antenna 38 or transmitting and receiving antenna 92, the main carrier wave $F_{c1}$ may be modulated by ASK (amplitude shift keying) or the like, as needed, based on information such as ID of the interrogator, predetermined hopping timing and hopping pattern.

In the above-described embodiments, the subcarrier modulator 56 of the transponder 14 is arranged to primarily modulate the subcarrier wave generated by the subcarrier oscillator 54, based on the information signal, by PSK (phase shifting keying). However, the modulation may be performed by other means such as FSK (frequency shift keying). That is, the manner of the modulation may be determined suitably depending upon construction of the communication system 10.

While the embodiments of the present invention have been described above for illustrative purpose only, it is to be understood that the present invention may be embodied with various changes and improvements, which may occur to those skilled in the art.

What is claimed is:

1. An interrogator that is incorporated in a communication system in which each of at least one transponder is operable, upon reception of a main carrier wave transmitted from said interrogator, to respond to said interrogator with a reflected wave that is generated by modulating the main carrier wave, said interrogator comprising:
   a transmitting portion operable to transmit the main carrier wave;
   a receiving portion operable to receive the reflected wave as a received signal;
   at least one first frequency-converter each operable to generate an intermediate frequency signal, by multiplying the received signal with a first local signal that is generated by a first local oscillator;
   at least one second frequency-converter each operable to generate a demodulated signal, by multiplying a converted signal converted from the intermediate frequency signal, with a second local signal that is generated by a second local oscillator; and
   a phase controller operable to control phase of the second local signal.

2. The interrogator according to claim 1, wherein said phase controller controls the phase of the second local signal generated by the second local oscillator, such that a signal-to-noise ratio of the demodulated signal is increased.

3. The interrogator according to claim 1, wherein said phase controller controls the phase of the second local signal generated by the second local oscillator, such that a signal-to-noise ratio of the demodulated signal is maximized.

4. The interrogator according to claim 1, further comprising an analog-to-digital converter interposed between said at least one first frequency-converter and said at least one second frequency-converter, wherein each of said at least one second frequency-converter generates the demodulated signal by a digital processing.

5. The interrogator according to claim 4, wherein said phase controller controls the phase and frequency of the second local signal generated by the second local oscillator, based on one cycle of the periodic function that is previously calculated.

6. The interrogator according to claim 5, wherein said phase controller controls the second local signal generated by the second local oscillator, such that the generated second local signal corresponds to one of a plurality of second local signals which are previously calculated and which are different from each other with respect to at least one of the phase and the frequency thereof.

7. The interrogator according to claim 5, wherein a number of said at least one second frequency-converter is the same as the number of cycle of one periodic function.

8. The interrogator according to claim 4, wherein a sampling frequency of said analog-to-digital converter is at least four times as high as a frequency of the intermediate frequency signal.

9. The interrogator according to claim 4, wherein a sampling frequency of said analog-to-digital converter is determined based on a frequency of a main carrier component of the intermediate frequency signal.

10. The interrogator according to claim 4, further comprising:
    a main carrier oscillator operable to generate the main carrier wave;
    an intermediate-frequency signal mixer operable to generate an intermediate frequency signal, by multiplying the main carrier wave with the first local signal;
    a frequency divider operable to generate a frequency-divided signal, by frequency-dividing the intermediate frequency signal; and
    a clock signal mixer operable to generate a clock signal, by multiplying the frequency-divided signal with the intermediate frequency signal, such that the generated clock signal serves as a clock of said analog-to-digital converter.

11. The interrogator according to claim 10, wherein said frequency divider generates the frequency-divided signal, by frequency-dividing the intermediate frequency signal with a frequency division ratio of 0.2.

12. The interrogator according to claim 1, wherein said phase controller controls the phase and frequency of the second local signal generated by the second local oscillator, based on one cycle of at least one periodic function that is previously determined.

13. The interrogator according to claim 12, wherein said phase controller controls the second local signal generated by the second local oscillator, such that the generated second local signal corresponds to one of a plurality of second local signals which are previously determined and which are different from each other with respect to at least one of the phase and the frequency thereof.

14. The interrogator according to claim 1, wherein said at least one second frequency-converter includes a plurality of second frequency-converters operable to generate respective demodulated signals, based on respective second local signals which are different from each other with respect to at least one of the phase and the frequency thereof.

15. The interrogator according to claim 1, wherein said at least one second frequency-converter includes the same number of second frequency-converters as communication channels established in the communication system, for each of the reflected waves received by the receiving portion,
    and wherein said second frequency-converters generate respective demodulated signals related to communications performed in the respective communication channels, based on respective second local signals which are different from each other with respect to at least one of the phase and the frequency thereof.

16. The interrogator according to claim 1, wherein with setting a maximum number of said second frequency converter to a number of communication channels established in the communication system, a number of said at least one second frequency-converter is changeable depending upon a number of said at least one transponder established in the communication system.

17. The interrogator according to claim 1, wherein each of said at least one second frequency-converter generates the demodulated signal through an orthogonal demodulation in which an input signal inputted to the second frequency-converter is converted into a complex signal including in-phase and quadrature-phase signals, and wherein said phase controller controls the phase of the second local signal as said input signal, such that said quadrature-phase signal is minimized.

18. The interrogator according to claim 1, wherein said transmitting portion includes:
- a main carrier oscillator operable to generate the main carrier wave;
- a divider operable to divide the main carrier wave into a transmission signal and a cancel signal;
- a transmission signal amplifier operable to amplify the transmission signal; and
- a transmitting antenna operable to transmit the transmission signal, wherein said receiving portion includes:
- a receiving antenna operable to receive the reflected wave as the received signal; a cancel-signal amplitude adjuster operable to adjust amplitude of the cancel signal;
- a cancel-signal phase adjuster operable to adjust phase of the cancel signal; and
- a combiner operable to combine the cancel signal and the received signal after the amplitude and phase of the cancel signal have been adjusted by the respective adjusters, and to output an output in the form of combination of the received signal and the cancel signal, and wherein said cancel-signal amplitude adjuster and said cancel-signal phase adjuster adjust the amplitude and phase of the cancel signal, respectively, such that the output signal of said combiner is reduced.

19. The interrogator according to claim 1, further comprising a transmitting and receiving antenna operable to transmit the main carrier wave and receive the reflected wave as the received signal, wherein said transmitting portion includes:
- a main carrier oscillator operable to generate the main carrier wave;
- a divider operable to divide the main carrier wave into a transmission signal and a cancel signal;
- a transmission signal amplifier operable to amplify the transmission signal; and
- a separator operable to supply the amplified transmission signal to said transmitting and receiving antenna and to supply the received signal to said receiving portion, wherein said receiving portion includes:
- a cancel-signal amplitude adjuster operable to adjust amplitude of the cancel signal;
- a cancel-signal phase adjuster operable to adjust phase of the cancel signal; and
- a combiner operable to combine the cancel signal and the received signal after the amplitude and phase of the cancel signal have been adjusted by the respective adjusters, and to output an output in the form of combination of the received signal and the cancel signal, and wherein said cancel-signal amplitude adjuster and said cancel-signal phase adjuster adjust the amplitude and phase of the cancel signal, respectively, such that the output signal of said combiner is reduced.

20. The interrogator according to claim 1, further comprising:
- a main carrier oscillator operable to generate the main carrier wave; and
- a reference frequency generator operable to generate a reference frequency, wherein said main carrier oscillator and said first local oscillator generate the main carrier wave and the first local signal, respectively, based on the reference frequency.

21. The interrogator according to claim 1, further comprising:
- a main carrier oscillator operable to generate the main carrier wave;
- a cancel signal mixer operable to generate a cancel signal, by multiplying the main carrier wave with the first local signal;
- a cancel-signal amplitude adjuster operable to adjust amplitude of the cancel signal;
- a cancel-signal phase adjuster operable to adjust phase of the cancel signal; and
- a combiner operable to combine the cancel signal and the intermediate frequency signal after the amplitude and phase of the cancel signal have been adjusted by the respective adjusters, and to output an output in the form of combination of the cancel signal and the intermediate frequency signal received signal, wherein said cancel-signal amplitude adjuster and said cancel-signal phase adjuster adjust the amplitude and phase of the cancel signal, respectively, such that the output signal of said combiner is reduced.

* * * * *